US011588982B2

United States Patent
Oh et al.

(10) Patent No.: US 11,588,982 B2
(45) Date of Patent: Feb. 21, 2023

(54) DEPTH IMAGE SENSOR WITH ALWAYS-DEPLETED PHOTODIODES

(71) Applicant: Microsoft Technology Licensing, LLC, Redmond, WA (US)

(72) Inventors: Minseok Oh, Santa Clara, CA (US); Satyadev Hulikal Nagaraja, San Jose, CA (US); Cyrus Soli Bamji, Fremont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 72 days.

(21) Appl. No.: 17/195,358

(22) Filed: Mar. 8, 2021

(65) Prior Publication Data

US 2022/0201187 A1    Jun. 23, 2022

Related U.S. Application Data

(60) Provisional application No. 63/130,329, filed on Dec. 23, 2020.

(51) Int. Cl.
| | |
|---|---|
| *H04N 5/235* | (2006.01) |
| *H04N 5/225* | (2006.01) |
| *H01L 27/146* | (2006.01) |

(52) U.S. Cl.
CPC ....... *H04N 5/2354* (2013.01); *H01L 27/1461* (2013.01); *H01L 27/1463* (2013.01); *H01L 27/14656* (2013.01); *H04N 5/2256* (2013.01)

(58) Field of Classification Search
None
See application file for complete search history.

(56) References Cited

U.S. PATENT DOCUMENTS

| | | | |
|---|---|---|---|
| 6,825,878 B1* | 11/2004 | Rhodes | H01L 27/14609 257/299 |
| 2012/0018618 A1* | 1/2012 | Roy | H01L 27/14612 257/E27.15 |

(Continued)

FOREIGN PATENT DOCUMENTS

| | | | | |
|---|---|---|---|---|
| EP | 3474038 A1 | 4/2019 | | |
| GB | 2510372 A | * | 8/2014 | H01L 27/1461 |
| GB | 2510372 A | | 8/2014 | |

OTHER PUBLICATIONS

"International Search Report and Written Opinion Issued in PCT Application No. PCT/US21/057490", dated Mar. 9, 2022, 14 Pages.

*Primary Examiner* — James M Hannett
(74) *Attorney, Agent, or Firm* — Alleman Hall Creasman & Tuttle LLP

(57) ABSTRACT

Examples are disclosed that relate to the use of an always-depleted photodiode in a ToF depth image sensor. One example provides a method of operating a pixel of a depth image sensor, the method comprising receiving photons in a photocharge generation region of the pixel, the photocharge generation region of the pixel comprising an always-depleted photodiode formed by a doped first region comprising one of p-doping or n-doping and a more lightly-doped second region comprising the other of p-doping or n-doping. The method further comprises, during an integration phase, energizing a clock gate for a pixel tap, thereby directing photocharge generated in the photocharge generation region to an in-pixel storage comprising a capacitor, and in a readout phase, reading charge out from the in-pixel storage.

19 Claims, 15 Drawing Sheets

(56) References Cited

U.S. PATENT DOCUMENTS

| | | | |
|---|---|---|---|
| 2013/0193546 A1* | 8/2013 | Webster | H01L 31/02363 |
| | | | 257/438 |
| 2017/0118429 A1* | 4/2017 | Ni | H01L 27/14643 |
| 2017/0208272 A1* | 7/2017 | Guidash | H01L 27/14614 |
| 2020/0185439 A1* | 6/2020 | Jin | G11C 11/5607 |
| 2020/0350355 A1* | 11/2020 | Raynor | H01L 27/14603 |

* cited by examiner

DEPTH IMAGE SENSOR WITH ALWAYS-DEPLETED PHOTODIODES

CROSS REFERENCE TO RELATED APPLICATIONS

This application claims priority to U.S. Provisional Patent Application Ser. No. 63/130,329, titled DEPTH IMAGE SENSOR WITH ALWAYS-DEPLETED PHOTODIODES and filed Dec. 23, 2020, the entirety of which is hereby incorporated herein by reference for all purposes.

BACKGROUND

Time-of-flight (ToF) cameras determine depth by measuring the round-trip travel time for light between the camera and an object. In some ToF cameras, a temporally-modulated illumination light signal illuminates a scene, and image sensor pixels capture phase information for the reflected illumination light, from which a distance value is calculated for each pixel.

SUMMARY

Examples are disclosed that relate to the use of an always-depleted photodiode in a ToF depth image sensor. One example provides a method of operating a pixel of a depth image sensor, the method comprising receiving photons in a photocharge generation region of the pixel, the photocharge generation region of the pixel comprising an always-depleted photodiode formed by a doped first region comprising one of p-doping or n-doping and a more lightly-doped second region comprising the other of p-doping or n-doping. The method further comprises, during an integration phase, energizing a clock gate for a pixel tap, thereby directing photocharge generated in the photocharge generation region to an in-pixel storage comprising a capacitor, and in a readout phase, reading charge out from the in-pixel storage.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
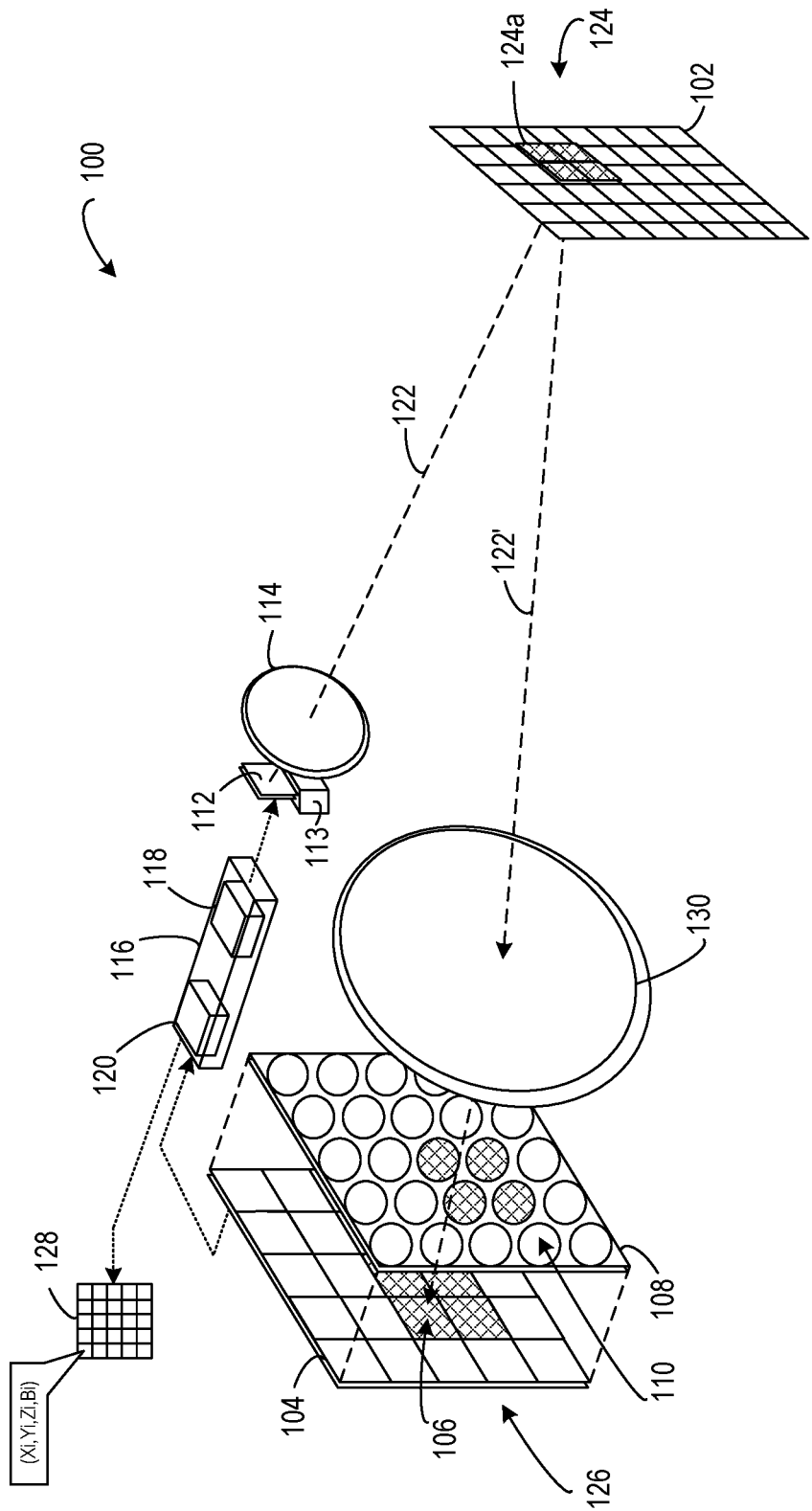
FIG. 1 is an exploded schematic view showing aspects of an example time-of-flight (ToF) camera.

A time-of-flight (ToF) camera determines, for each addressable pixel of an image sensor of the camera, a depth of a subject (a distance from the subject to the pixel) based on a phase of a received light signal that is temporally modulated by a time-of-flight illuminator. The received light signal generates photocharge in a region of the pixel, thereby producing an electric charge signal. A ToF sensor modulates the pixel response in synchronization with the modulated illumination source to direct the charge to different taps of the pixel during an integration period. A global shutter mechanism may be used to simultaneously modulate the entire pixel array. Data is sampled at a plurality of different phases of the temporally modulated light signal, and a depth value for each pixel is determined using the signals acquired for each pixel tap at each illumination phase that is sampled.

Modulating the pixel response comprises modulating a voltage bias of one or more clock gates in the pixel to alternately direct photocharge to in-pixel storage of the respective pixel taps. Photocharge is generated as electron-hole pairs in a semiconductor material. In some depth image sensors, semiconductor material in a photocharge generation region of the pixel can be configured as a high-resistivity material to inhibit photoelectron-hole recombination. In such a pixel, the clock gates are operated at biases sufficient to transport the photocharge to the in-pixel storage within a corresponding modulation period. The use of too low a bias may result in slower transport that can harm modulation contrast due to photocharge migrating to the wrong pixel tap when the pixel tap polarities are switched.

Depth image sensors can be incorporated into wearable devices that are battery powered. As such devices often use batteries as power supplies, lower power operation of a depth image sensor can help to extend time between battery charges. However, power savings may be difficult to achieve for a ToF camera without undesirable trade-offs. For example, as mentioned above, using a relatively higher bias swing to effect faster electron transport in a high resistivity semiconductor material increases modulation contrast and distance accuracy at the expense of power efficiency. Conversely, operating a pixel with smaller bias swings can achieve power cost savings at the expense of a reduction in modulation contrast. Power efficiency may be even more of a concern at smaller pixel sizes (smaller pixel pitch) due to heat dissipation concerns.

One option to reduce power consumption is to employ a lower-resistivity semiconductor in the photocharge generation region. However, using a lower-resistivity material may result in prompt photoelectron-hole recombination, leading to an undesirable loss of signal strength. Increasing the illumination device power output to compensate may negate any such power savings in the pixels. Further, operating at higher voltages creates electron-hole pairs at photodiode or photogate junctions even in the absence of light that may increase dark current, which may impact signal-to-noise ratios.

Another strategy to lower power consumption is to selectively operate a subset of ToF pixels rather than the entire array of pixels on the depth image sensor, and to selectively direct illumination light to a corresponding region in the scene being imaged, rather than broadly across the scene. However, photocharge can accumulate in pixels outside the ROI and diffuse or "bloom" into pixels inside the ROI, thus adding signal noise and lowering modulation contrast.

Accordingly, examples are disclosed related to a depth image sensor pixel comprising an always-depleted photodiode. The always-depleted photodiode comprises a doped first region of one of p-doping or n-doping, and a more lightly-doped second region of the other of p-doping and n-doping located within the first region. The resulting p-n junction between the more heavily-doped first region and the more lightly-doped second region creates an always-depleted region within the more lightly-doped second region due to thermally-induced charge diffusion and drift that occurs under normal operating temperatures (e.g., 0° C. to 80° C.). As a result, a permanent electric field is created that extends substantially or completely through the depth of the pixel. The electric field helps to separate photogenerated electron-hole pairs without the use of a higher resistivity semiconductor material, and thereby allows lower power operation without sacrificing modulation contrast. Further, in some examples, a ToF pixel comprising an always-depleted photodiode may be operated selectively in a lower power mode for power savings, or a higher-power mode that provides for a higher in-pixel storage capacity (or higher "full well capacity") and higher modulation frequencies.

As mentioned above, a ToF image sensor can be operated to image just a region of interest toward which illumination light is selectively directed. In such examples, blooming of photocharge from pixels outside of the region of interest into pixels within the region of interest can impact modulation contrast. As such, examples are also disclosed that utilize horizontal anti-blooming gates and vertical anti-blooming gates to drain photocharge from pixels outside of the region of interest.

Prior to discussing these examples in detail, FIG. 1 shows aspects of an example depth image sensor 100 comprising a ToF camera. The term 'camera' refers herein to any imaging component having at least one optical aperture and sensor array configured to image a scene 102 or subject. Depth image sensor 100 includes a sensor array 104 of individually addressable pixels 106 integrated into a semiconductor die, such as a silicon die. As described in more detail below, pixels 106 comprise always-depleted photodiodes (ADP). In some implementations, the pixels may be complementary metal-oxide semiconductor (CMOS) elements, but other suitable architectures are also envisaged. Each pixel may be responsive to light over a broad wavelength band, although this is not required. Sensor array 104 is schematically illustrated with twenty-five individually addressable pixels 106 for simplicity, although any suitable number of pixels 106 may be used.

In some implementations, the pixels 106 of sensor array 104 may be differential pixels. Each differential pixel may include different collection terminals ("taps") that are energized according to different clock signals. In one example, to measure modulated illumination light using two taps, two clock signals that are substantially complementary (e.g., the two clock signals have 50% duty cycles that are 180 degrees out of phase) can be used to control the taps. In other examples, the two different clock signals may have a different relationship, such as for measuring ambient illumination or non-modulated active illumination. In other camera implementations that do not include sensor arrays of differential pixels, additional clock cycles may be used to perform a differential measurement. While differential pixels can provide advantages, other types of sensor array, including non-differential sensor arrays, may be used.

Microlens array 108 optionally may be arranged over sensor array 104. Microlens array 108 includes a plurality of microlens elements 110. Each microlens element 110 of microlens array 108 may be registered to a pixel 106 of the sensor array 104. When included, microlens array 108 may provide a larger effective fill factor at each of the pixels, for increased collection efficiency and reduced cross-talk between pixels.

A ToF illuminator 112 is configured to selectively emit active light to illuminate the scene 102. In one example, ToF illuminator 112 includes an IR laser configured to emit IR light. In some examples, ToF illuminator 112 optionally may include a diffuser covering a field of illumination of ToF illuminator 112. Depth measurements may be taken using IR light, including near infrared (NIR) light, far infrared (FIR) light, or any other suitable wavelength. Although not shown in FIG. 1, the depth image sensor optionally may include a bandpass filter to limit the portion of the electromagnetic spectrum reaching the pixels 106 to the portion of the electromagnetic spectrum emitted by ToF illuminator 112.

In other examples, ToF illuminator 112 may be configured to emit active illumination light in a visible spectral band. In some examples, ToF illuminator 112 may include a broadband illumination source, such as a white light source. Further, in some examples, ToF illuminator 112 may include a plurality of spectral illuminators (e.g. LEDs). In some such examples, the plurality of spectral illuminators may be configured to emit active illumination in the same spectral band, although this is not required.

In some examples, ToF illuminator 112 comprises a steerable illumination source configured to selectively emit active illumination light having a narrow field that is sized to illuminate one or more illumination zones in the scene 102. Further, the steerable illumination source comprises a steering element 113 configured to steer the active illumination light 122 emitted from steerable illumination source to individually actively illuminate different illumination zones (e.g., zone 124a) of a plurality of target illumination zones 124 in scene 102 viewed by sensor array 104. Such a zoned arrangement produces an illumination light having a smaller angular extent than the field of view of sensor array 104, and thereby may provide a greater power density for the same peak power of the illumination relative to full-field imaging. An illumination zone may be configured to be any suitable size that is less than an entire field of view of the scene viewed by sensor array 104. Any suitable number of illumination zones may be used to collectively cover the field of view of the sensor array 104. Further, any suitable number of pixels of the sensor array may be mapped to each illumination zone.

Steering element 113 may include any suitable mechanical, electro optical, micro-electro-mechanical-systems (MEMS), electrowetting prism componentry, and/or other steering componentry configured to suitably steer the active illumination emitted from the steerable illumination source to illuminate a designated illumination zone. In some examples, steering element 113 may comprise a movable mirror, providing for a mechanical steering component to steer the active illumination light to illuminate an illumination zone in scene 102. In other examples, steering element 113 may comprises a refracting lens (e.g., Fresnel, prismatic, etc.) that directs, or steers, light in differing directions based on the input light's lateral position. In further examples, steering element 113 may comprise a switchable polarization grating, providing for an electro-optical steering component. In yet further examples, steering element 113 may comprise a liquid crystal lens system (for example a pair of liquid crystal lenses), providing for steering by an electrowetting steering solution (an electrowetting component). In some such examples, the liquid crystal lenses may be arrays of microlenses suspended in a liquid crystal that can be adjusted electrically to steer light.

In some implementations, ToF illuminator 112 optionally may include one or more optical elements 114. For example, the optical element(s) 114 may include one or more of a collimating element, a diffusing element, and a focusing element. The collimating element may be operative to collimate light emitted from ToF illuminator 112 into collimated light. The diffusing element may be operative to diffuse light emitted from ToF illuminator 112, thereby converting the collimated light into diffused light having a desired profile (e.g., uniform or Gaussian power profile). The focusing element may be operative to focus the diffused light at a designated focal length. Such a designated focal length may be selected based on application or any other suitable factors. In some implementations, any or all of these optical elements may be omitted from ToF illuminator 112.

Electronic controller 116 may include a logic machine 118 and storage machine 120. The storage machine may hold instructions that cause the logic machine to enact any operation, algorithm, computation, or transformation disclosed herein. In some implementations, the logic machine may take the form of an application-specific integrated circuit (ASIC) or system-on-a-chip (SoC), in which some or all of the instructions are hardware- or firmware-encoded. Electronic controller 116 may be operatively connected to sensor array 104, ToF illuminator 112, and/or steering element 113. In some examples, electronic controller 116 includes a ToF controller machine and/or an output machine, which may be implemented as separate physical hardware and/or firmware components or incorporated into a single hardware and/or firmware component.

Electronic controller 116 is configured to repeatedly activate the ToF illuminator 112 and synchronously address the pixels 106 of sensor array 104 to acquire IR images. The active light signal emitted from ToF illuminator 112 may be temporally modulated in different modulation frequencies for different image captures. In the illustrated example, electronic controller 116 activates ToF illuminator 112 to illuminate scene 102 with modulated IR light 122 and addresses the pixels of sensor array 104 in synchronicity. IR light 122' reflects from the scene 102 back to the camera 100. The reflected IR light 122' passes through receiving optics and is incident on the pixels of sensor array 104 to provide a measurement. For example, the measurement may be an intensity measurement of active IR light back-reflected from the subject to the pixel. In the illustrated example, IR light 122' is measured by a pixel 106 of sensor array 104, thus providing phase information useable with the knowledge of the camera's configuration to determine the world space position of a locus of scene 102.

In some examples, electronic controller 116 controls steering element 113 to steer active light 122 towards illumination zone 124. As such, reflected light 122' from objects in illumination zone 124 passes through receiving optics, indicated schematically at 130, and is incident on pixels within a region of interest (ROI) 126. As discussed below with respect to FIG. 9, electronic controller 116 may selectively operate the pixels within ROI 126 to determine depth values for the pixels, while pixels outside ROI 126 are operated to drain photocharge to prevent blooming. In some examples, ROI depth imaging can be performed across a plurality of illumination zones (e.g., by scanning through ROIs) to produce a full array depth image. In other examples, ROI depth imaging can be performed on demand where the ROI is identified via intensity changes in a mono or RGB camera image. Such an image may be acquired via a separate camera or via depth image sensor 100 operating in a passive mode, as examples.

Electronic controller 116 is configured to generate a depth image 128 based on a plurality of captured IR images. The term 'depth image' refers to an array of individually addressable image pixels registered to corresponding regions ($X_i$, $Y_i$) of an imaged scene, with a depth value $Z_i$ indicating, for each image pixel, the depth of the corresponding region. 'Depth' is defined as a coordinate parallel to the optical axis of the camera, which increases with increasing distance from the camera. The term 'depth video' can be used to refer to a time-resolved sequence of depth images. Electronic controller 116 is configured to output depth image 128.

The depth or distance value for a pixel is calculated based on the phase shift of the sensed back-reflected light. The quality of the depth determination may depend on the quantum efficiency (QE) of the image sensor, defined as the number of electrons generated per incident photon, and on the signal contrast between the taps, also known as demodulation contrast. As mentioned above, current ToF pixels may utilize high-resistivity material in the photocharge generation region to impede electron-hole recombination, combined with the use of relatively larger voltage bias swings to achieve sufficient demodulation contrast. However, the relatively larger bias swings may increase power consumption compared to relatively smaller bias swings.

Thus, as mentioned above, an always-depleted photodiode can be used to provide an electric field that separates electron-hole pairs, thereby allowing the use of smaller bias swings in combination with a lower-resistivity semiconductor material.

Figure 2:
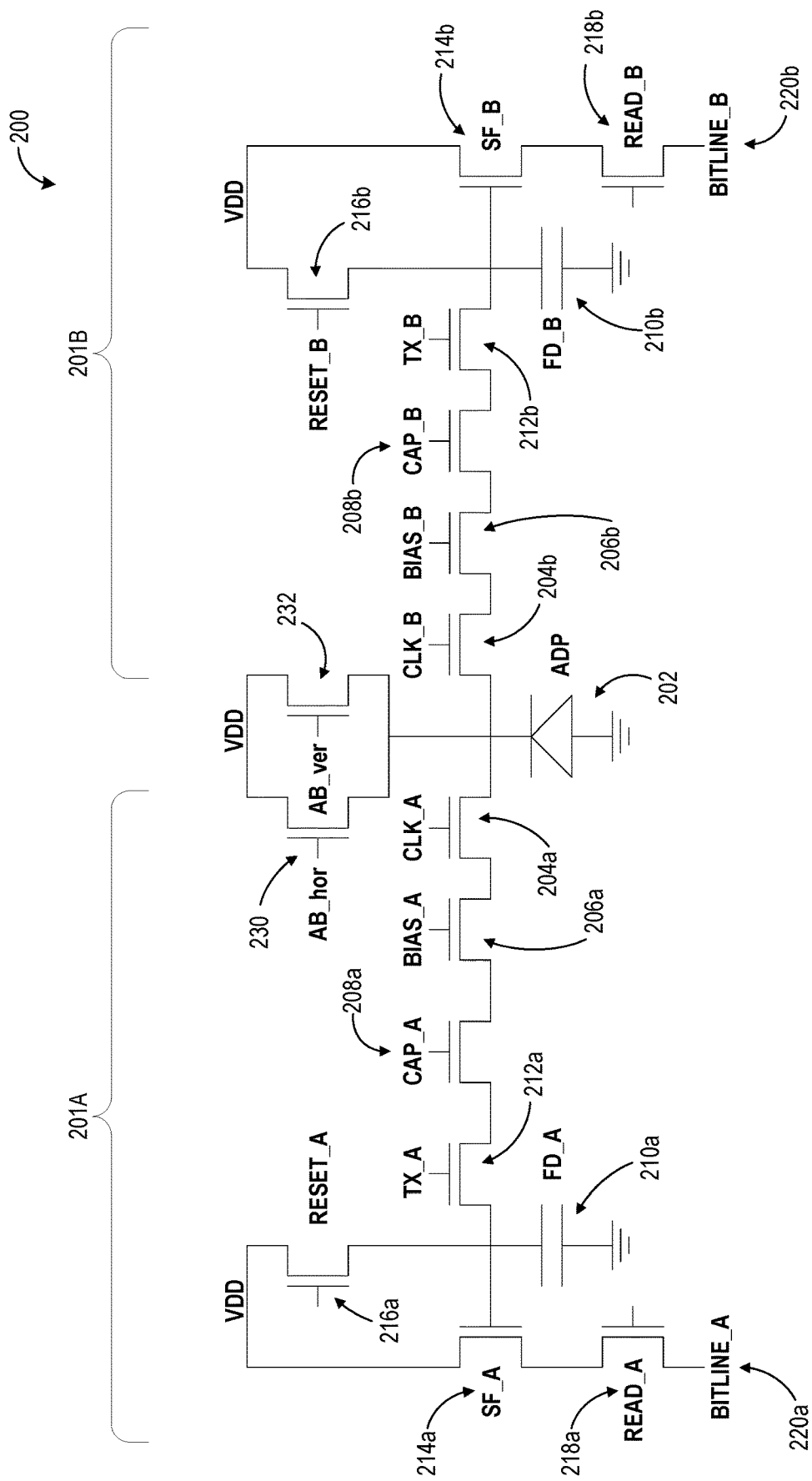
FIGS. 2-3 show electrical schematics for example ToF pixels each comprising an always-depleted photodiode.

FIG. 2 shows an electrical schematic diagram for an example ToF pixel 200 comprising an always-depleted photodiode (ADP) 202. ToF pixel 200 includes two pixels taps, indicated here as tap 201A and tap 201B. In other examples, a ToF pixel may include any other suitable number of taps, including a single tap or more than two taps. ToF pixel 200 further includes a horizontal anti-blooming gate (AB_hor) 230 and a vertical anti-blooming gate (AB_ver) 232.

Each pixel tap includes a clock gate CLK_A 204a, CLK_B 204b configured to direct charge from ADP 202 to a respective pixel tap during an integration period. During an integration period, clock gates 204a and 204b are modulated out of phase from each other. Each pixel tap further includes a bias gate BIAS_A 206a, BIAS_B 206b and an in-pixel storage capacitor CAP_A 208a, CAP_B 208b. Capacitors 208a, 208b are configured to receive and store charge that is collected via the corresponding clock gate 204a, 204b during the integration period, and thus act as in-pixel storage during integration. Bias gates 206a and 206b are operable to direct charge to capacitors 208a and 208b, during integration, and to prevent backflow of charge from capacitors 208a, 208b during other phases of operation than integration. After integration and during readout, charges stored on capacitors 208a, 208b are transferred to respective floating diffusion (FD) capacitors 210*a*, 210*b* via operation of transfer gate 212*a*, 212*b*. Charge on each FD capacitor 210*a*, 210*b* is read as a voltage across a corresponding source follower gate 214*a*, 214*b*, thereby providing an analog voltage signal for that pixel tap. The controller then drains charge via a reset gate 216*a*, 216*b* (RG_A, RG_B). The ToF pixel 200 further includes a selection gate 218*a*, 218*b* (READ_A, READ_B) operable to select a tap for readout.

Figure 3:
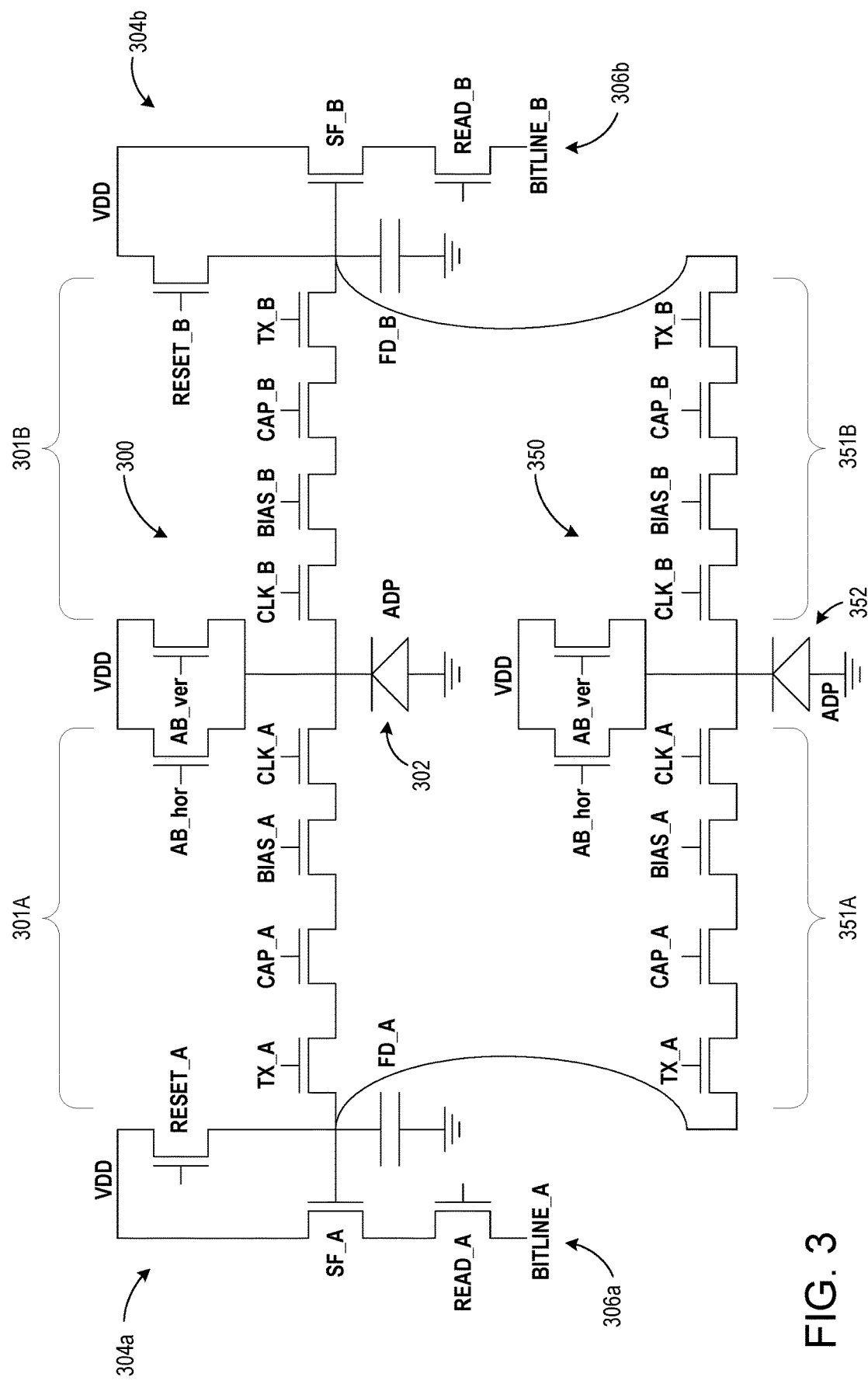

In some examples, two or more pixels can share readout circuitry. FIG. 3 shows an electrical schematic diagram for ToF image sensor in which taps of two pixels 300, 350 share common readout circuitry. More particularly, ToF pixels 300, 350 each comprises an ADP 302, 352 and an "A" pixel tap 301A, 351A, where each "A" pixel tap comprises a clock gate, a bias gate, in-pixel storage, and a transfer gate. ToF pixels 300, 350 further each comprises a "B" pixel tap 301B, 351B, each "B" pixel tap having the same components as the "A" pixel taps. The two "A" pixel taps 301B, 351B share readout circuitry 304*b*, while the two "B" pixel taps 301B, 351B share readout circuitry 304*b*. As such, photocharge from either tap 301B or 351B may be read out at collection node 306*b* (BITLINE_A). Likewise, photocharge from either tap 301B or tap 351B may be read out at collection node 306*b* (BITLINE_B).

Figure 4A:
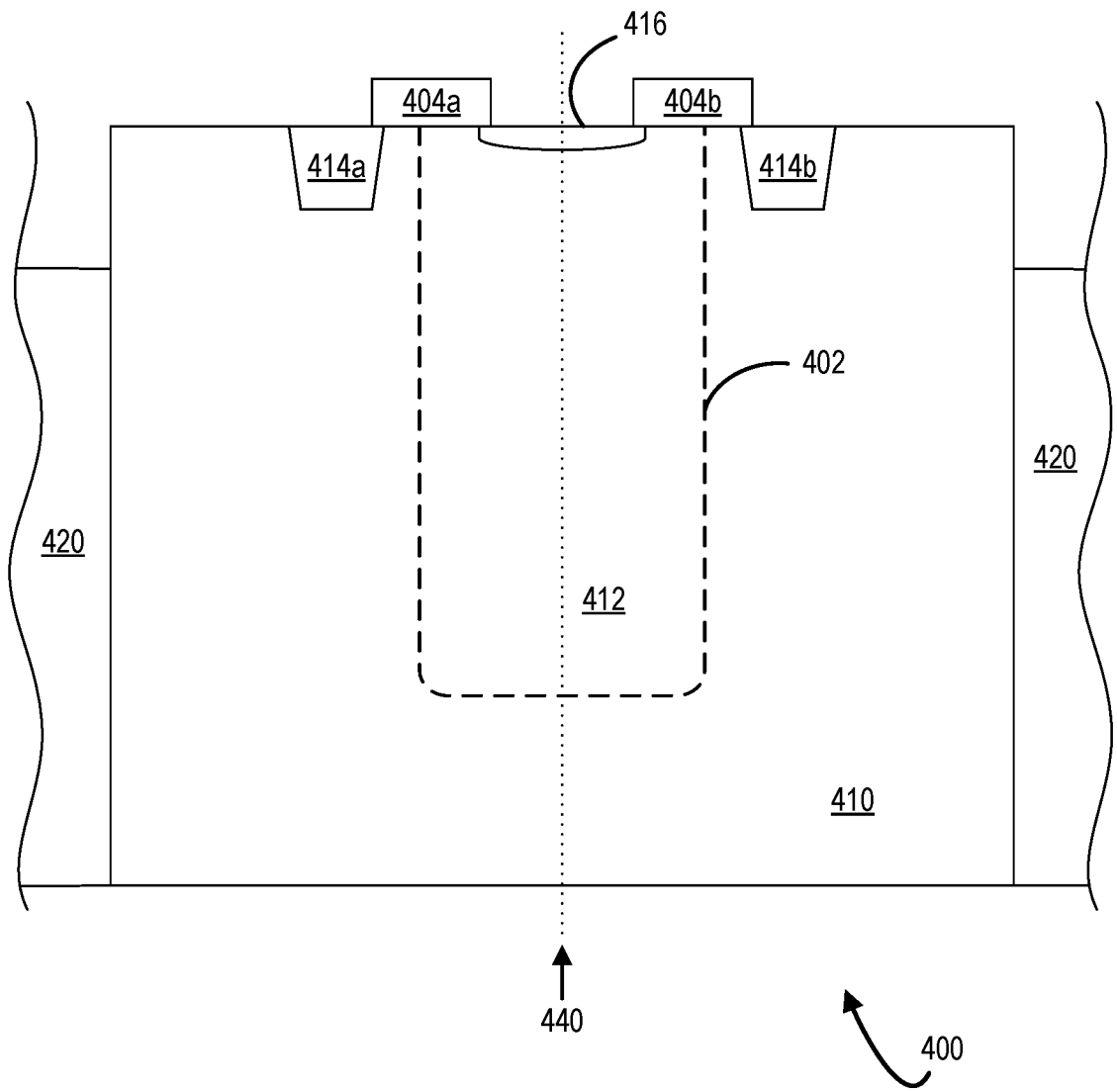
FIGS. 4A-4C schematically show a magnified, sectional view of an example ToF pixel comprising an always-depleted photodiode, and showing graphs of a modeled electrostatic potential and modeled electric field in the ToF pixel.

FIG. 4A shows a sectional view of an example ToF pixel 400 comprising an ADP including P-N junction 402. Pixel 400 is an example implementation of pixel 200 of FIG. 2. Pixel 400 can be controlled to modulate voltage at pixel taps during an integration period to acquire a depth image. During an integration period, clock gates 404*a*, 404*b* are alternately energized to direct charge to corresponding in-pixel storage capacitors via bias gates.

Pixel 400 comprises a doped first region 410 of a semiconductor die, and a more lightly-doped second region 412 formed within doped first region 410. Doped first region 410 comprises a different doping than more lightly-doped second region 412. In some examples, doped first region 410 may comprise p-doping (e.g., B-doped Si) while more lightly-doped second region 412 comprises n-doping (e.g., As or P-doped Si). Alternatively, ToF pixel may comprise an n-doped first region with a more-lightly p-doped second region. More lightly-doped second region 412 may comprise a dopant concentration that is orders of magnitude less than doped first region 410. For example, dopant concentration in more lightly-doped second region 412 may be less than $10^{16}$ dopant atoms/cm$^3$, or even less than $10^{14}$ dopant atoms/cm$^3$ while dopant concentration in doped first region 410 may be twice as high or greater (e.g., 10×, 100×, or 1000× greater). In some examples, doping concentration in doped first region 410 is greater than $10^{17}$ dopant atoms/cm$^3$.

Figure 4B:
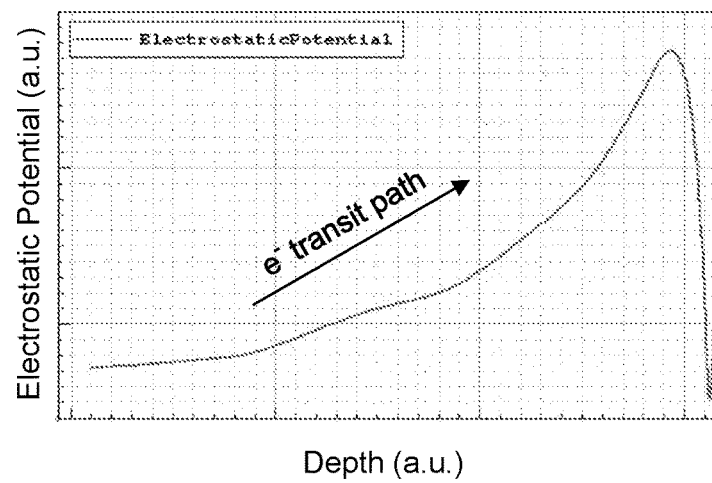
Figure 4C:
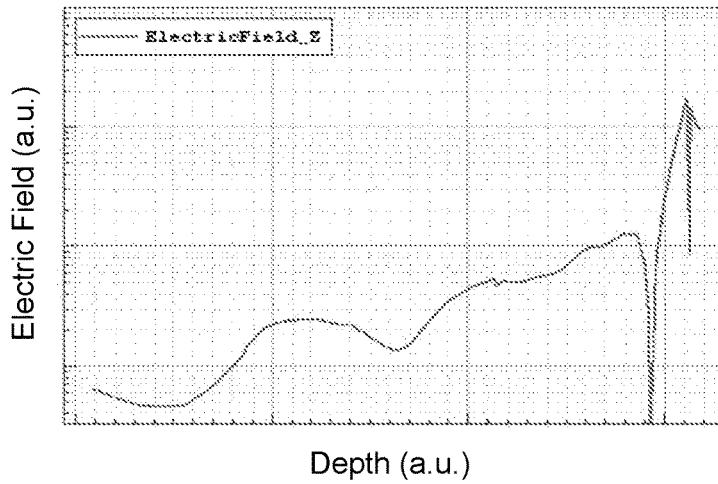

Light incident on pixel 400 generates photocharge (electron/hole pairs) in regions 410 and 412. After generation, electron-hole pairs may recombine, or may separate and become integrated photocharge. As mentioned above, ToF pixel 400 comprises an electric field across P-N junction 402 of the ADP. The volume and magnitude of the attractive field is a function of the volume of the always-depleted region created by P-N junction 402. In some examples, the pixel may be configured such that the P-N junction extends through the thickness of the pixel (e.g., from top to bottom in FIG. 4A) to thereby drive photocharge transport from all areas within the photocharge generation region. Referring to FIG. 4B, graph 442 shows an example modeled electrostatic potential of pixel 400 along line 440 of FIG. 4A. This model is based upon the pixel 400 comprising a p-well and lightly n-doped region therein, and would have an opposite polarity for an n-well with a lightly p-doped region therein. The electrostatic potential increases from the bulk (back) side to the transistor (front) side. As such, photoelectrons generated in the ADP migrate towards the clock gates due to this electric field. The drop in electrostatic potential at the transistor side represents divider region 416. The vertical electric field along line 440 is represented by graph 444. In FIG. 4C, graph 444 depicts a relatively strong electric field throughout most of the doped first region and the more lightly-doped second region. Again, the more abrupt changes in field strength near the transistor side represent the edges of divider region 416.

Returning to FIG. 4A, in some examples, pixel 400 further comprises shallow trench isolation (STI) regions 414*a*, 414*b* disposed at the transistor side of pixel 400, and/or a divider region 416 disposed within more lightly-doped second region 412 and between clock gate 404*a* and clock gate 404*b*. As the relative bias is modulated, divider region 416 may help reduce transfer of uncaptured photocharge from one clock gate to the other. Divider region 416 comprises a different doping than more lightly-doped second region 412.

In some examples, the depth image sensor also includes deep trench isolation (DTI) regions 420 comprising a dielectric material disposed between pixels. DTI regions 420 can help to prevent optical cross-talk (due to total internal reflection) and also prevent electrical cross-talk (due to photocharge diffusion) between neighboring pixels. DTI regions 420 each comprises a trench etched into the pixel array. In some examples, an oxide passivation layer can be deposited on the walls of the etched trench to passivate etch damage. This may help to avoid unwanted diffusion of dopants that can arise when annealing is used to repair etch damage. DTI regions 420 further comprise a high-κ dielectric material (e.g., a Ta-containing and/or Hf-containing material). In the case of a pixel with a p-well and a more lightly n-doped region forming the always depleted charge collection region, the high-κ dielectric may be chosen to form a fixed negative charge near the etch wall, which attracts holes in the Si semiconductor die, and thus helps to reduce dark current.

Figure 5A:
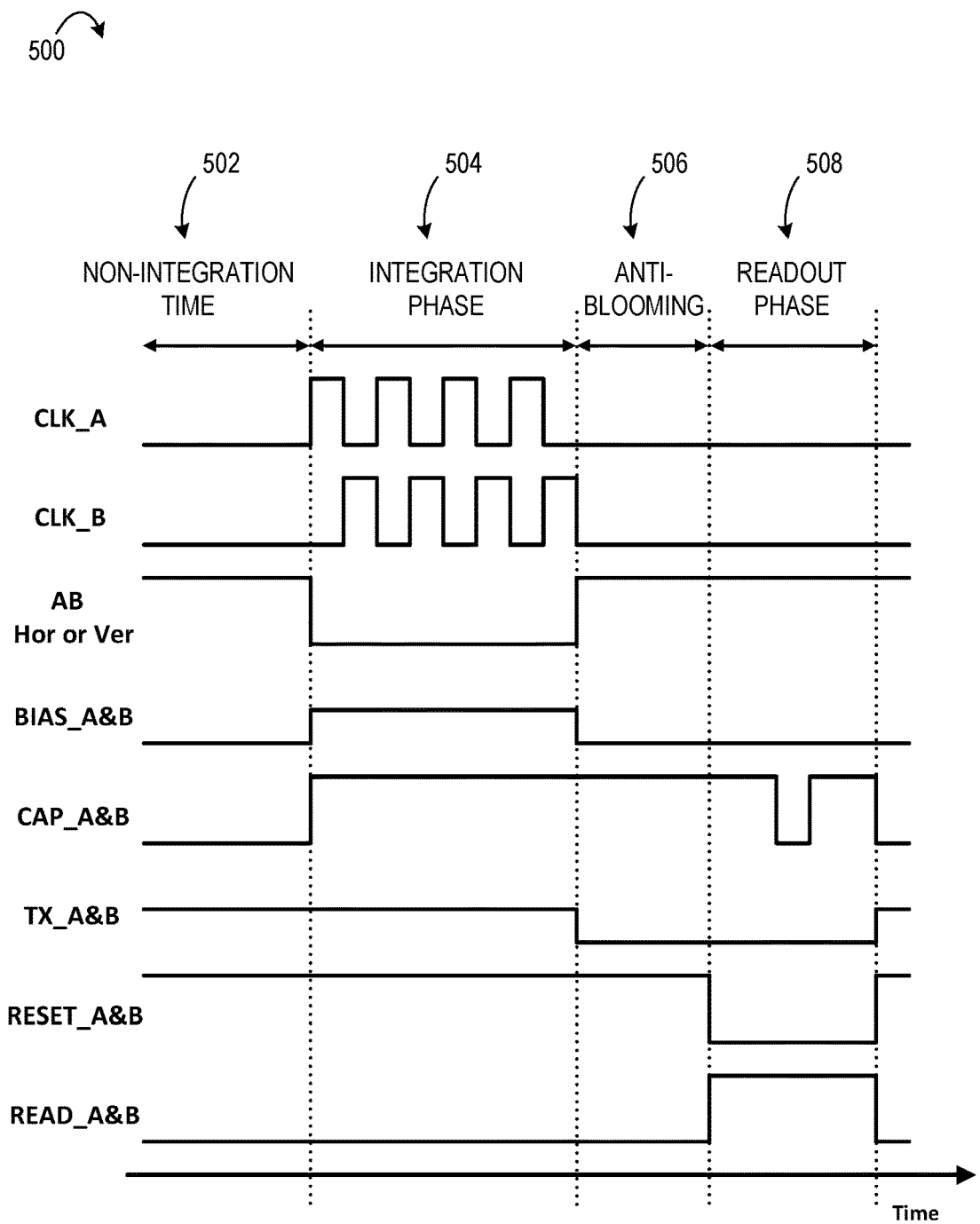
FIGS. 5A-5B show example timing and potential diagrams for operating the ToF pixel of FIG. 4 in a charge transfer mode.
Figure 5B:
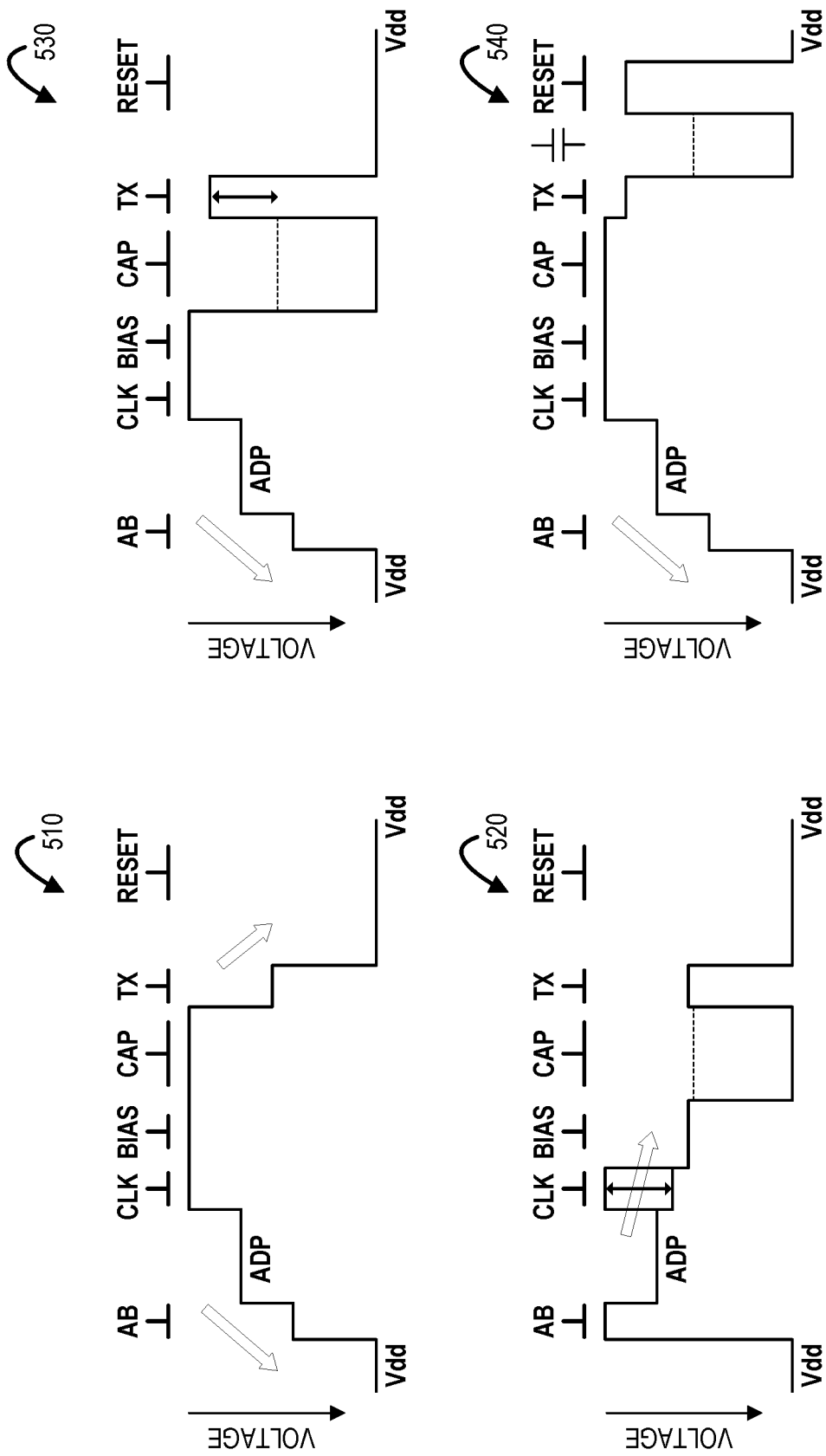

FIGS. 5A-5B illustrate an example operation of a ToF pixel such as pixel 200 or pixel 400 in a relatively lower power "charge-transfer" mode. FIG. 5A shows an example timing diagram 500, and FIG. 5B schematically illustrates potentials in the pixel and also charge flow at various stages in the timing diagram 500. The potential diagrams in FIG. 5B represent only one tap channel and includes only one anti-blooming gate for simplicity. Further, the y-axis represents voltage. The description of FIGS. 5A and 5B is in the context of a lightly n-doped region. However, it will be understood that the description can be adapted to a lightly p-doped region in an n-well with appropriate adjustments to signal polarities.

Timing diagram 500 illustrates a non-integration phase 502, an integration phase 504, an anti-blooming phase 506, and a readout phase 508. In the non-integration phase, clock gate A and clock gate B are not modulated, but instead are held at a relatively lower voltage, thereby posing a potential barrier to photoelectrons and preventing the photoelectrons from reaching either pixel tap. Further, anti-blooming gates (AB) are held high to drain photoelectrons that are produced by the ADP during the non-integration period, and bias gates (BIAS) and storage capacitors (CAP) are held low. This phase is illustrated at potential diagram 510 of FIG. 5B, which shows charges being drained to $V_{dd}$ via the anti-blooming gates and the reset gates.

Integration phase 504 is illustrated by potential diagram 520. In the integration phase, the clock gates are alternately energized to direct photoelectrons to respective storage capacitors (CAP) (e.g. CAP_A and CAP_B of FIG. 2), which are switched high to store photoelectrons. Likewise, the anti-blooming gates are switched to low to avoid draining photoelectrons via the anti-blooming gates. As shown in FIG. 5B at 520, modulation of a clock gate (CLK) alternately prevents and allows photoelectron transfer to storage capacitor (CAP) across the bias gate (BIAS). In a two-tap pixel, when one clock gate is high, the other clock gate is low. At the end of integration phase 504, the integrated charge from all modulation cycles is held at storage capacitor (CAP) for a respective pixel tap. Any suitable number of cycles may be used during the integration phase. As discussed above, the relative CLK bias changes during integration phase 504 may be relatively small due to the built-in electric field created by the P-N junction than in pixels in which a higher resistivity semiconductor material is used without an ADP. The relatively smaller bias change may lead to lower power consumption.

During anti-blooming phase 506, represented by potential diagram 530 of FIG. 5B, the anti-blooming gates are energized to drain photoelectrons from the ADP. Additionally, the bias of the transfer gate (TX) is decreased to provide voltage headroom on the FD capacitor. However, the bias gate potential remains slightly higher than the transfer gate potential. Furthermore, the clock gates and bias gates are turned off during the anti-blooming phase, decreasing their potentials to prevent collecting photoelectrons from the ADP during this phase.

During readout phase 508, represented by potential diagram 540, the bias of the reset gate is decreased, and the integrated photocharge is transferred by lowering the bias applied to the storage capacitors, thereby transferring charge to the FD capacitor. Anti-blooming gates may be energized to drain photoelectrons from the ADP during this phase.

Figure 6A:
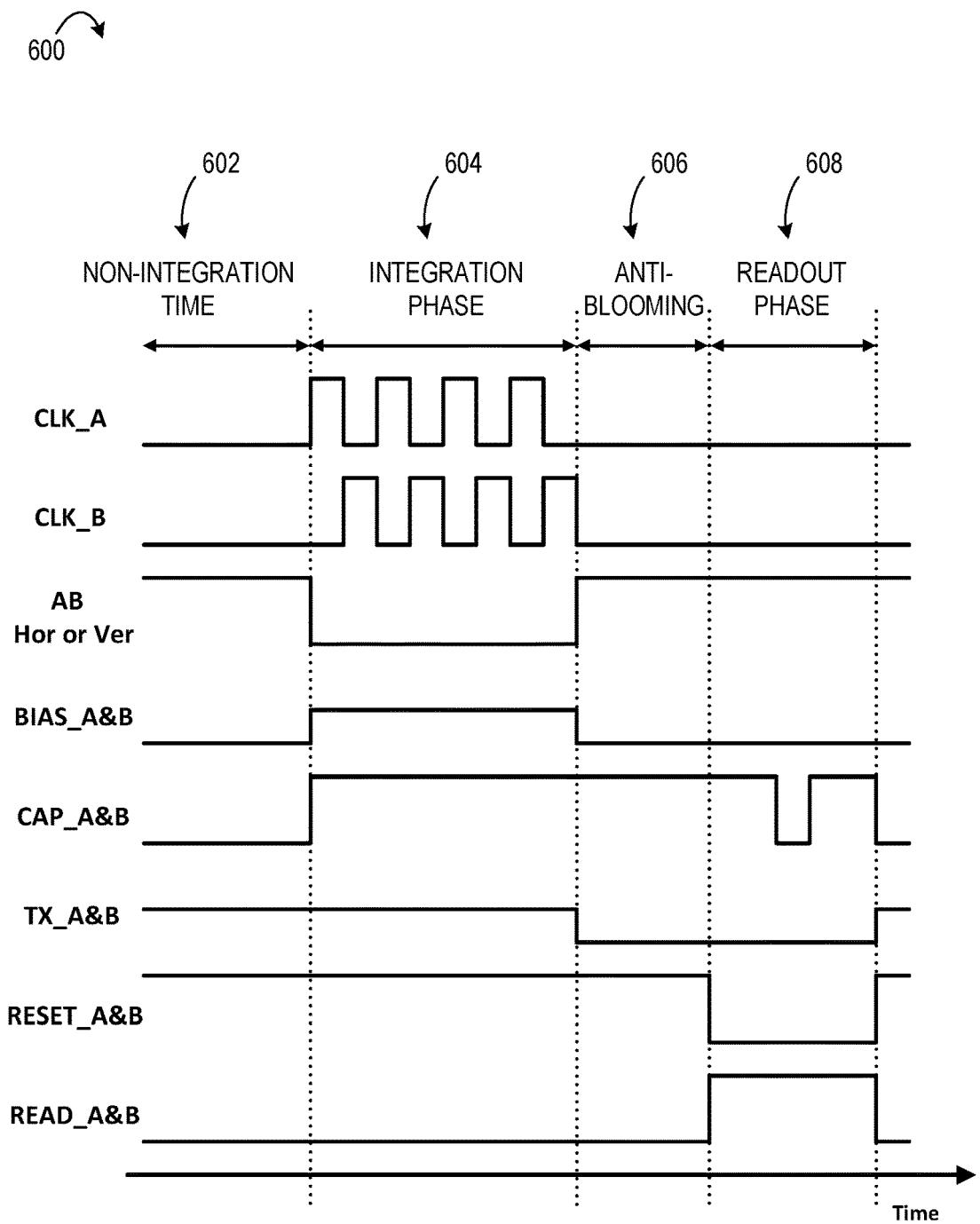
FIGS. 6A-6B show example timing and potential diagrams for operating the ToF pixel of FIG. 4 in a charge pump mode.
Figure 6B:
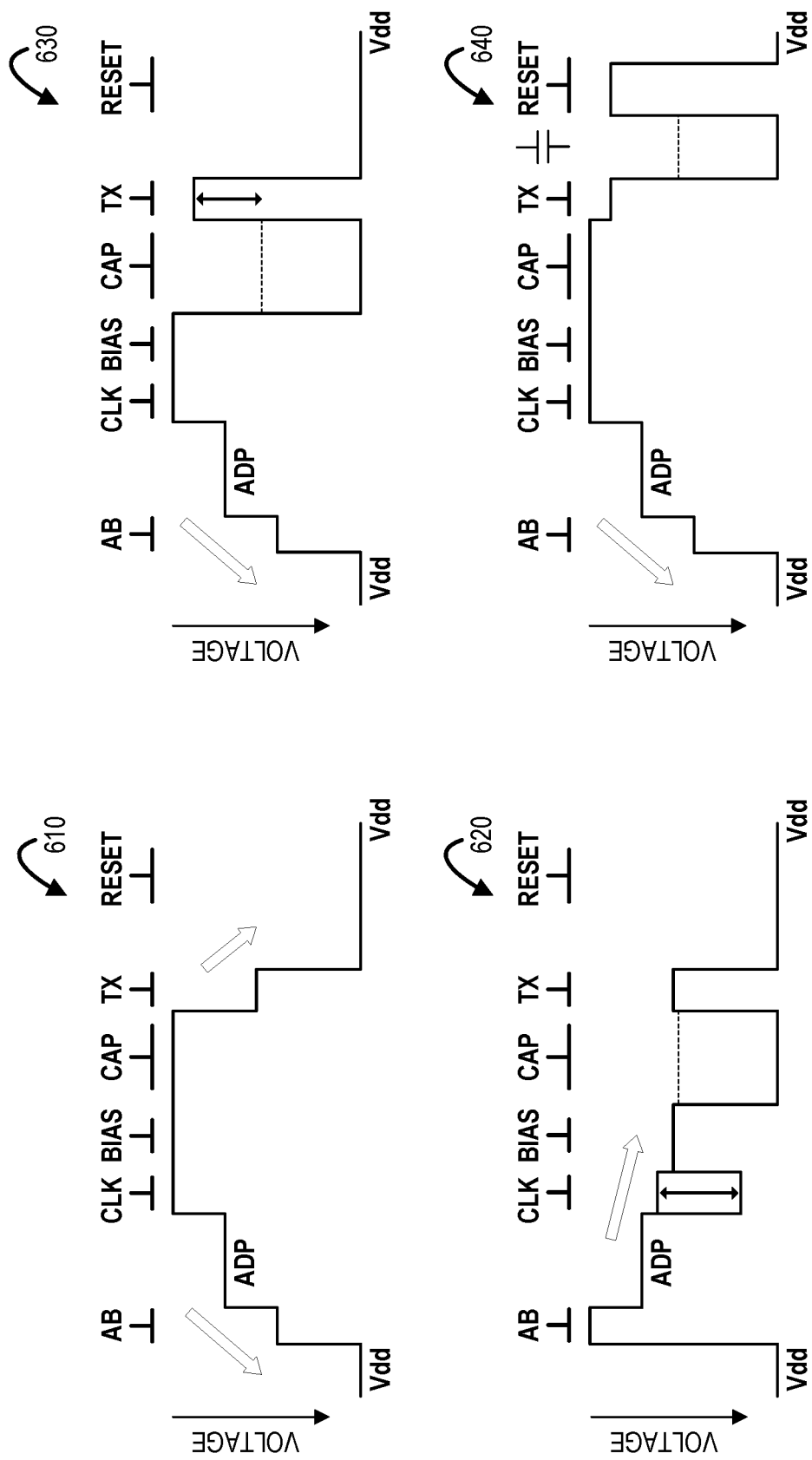

FIGS. 6A-6B illustrate an example operation of a ToF pixel, such as pixel 200 or pixel 400, in a relatively higher power "charge pump" mode. As opposed to the "charge transfer" mode of FIGS. 5A-5B, the charge pump mode of FIGS. 6A and 6B may provide for faster modulation frequencies and higher modulation contrast, but also may consume more power. The potential diagrams in FIG. 6B represent only one tap channel and includes only one anti-blooming gate for simplicity.

Timing diagram 600 illustrates a non-integration phase 602, an integration phase 604, an anti-blooming phase 606, and a readout phase 608. Non-integration phase 604 is illustrated by potential diagram 610. In the non-integration phase, clock gate A and clock gate B are not modulated, but instead are held at a relatively lower voltage, thereby posing a potential barrier to photoelectrons and preventing the photoelectrons from reaching either pixel tap. As before, anti-blooming gates (AB) are held high to drain photoelectrons that are produced by the ADP during the non-integration period, while bias gates (BIAS) and storage capacitors (CAP) are held low. Charges are drained to $V_{dd}$ via AB and reset gates (RESET).

Integration phase 604 is illustrated by potential diagram 620. In the integration phase, the clock gates are alternatively energized to direct photoelectrons to respective storage capacitors (CAP). Capacitors are biased high to store photoelectrons and anti-blooming gates are biased low to avoid draining photoelectrons. As shown in FIG. 6B at 620, modulation of a clock gate alternately draws photoelectrons from the ADP to trap the photoelectrons at the clock gate and then "pumps" accumulated photoelectrons across the bias gate into the capacitor. At the end of integration phase 604, the integrated charge from all modulation cycles is held at the storage capacitor for a respective pixel tap. When held high, the relatively large potential difference between the CLK and the ADP creates a stronger electric field compared to the integration phase of the "charge-transfer" mode illustrated in potential diagram 520. As discussed above, the higher electric field may better attract charge and achieve a greater modulation contrast.

During anti-blooming phase 606, represented by potential diagram 630 of FIG. 6B, the anti-blooming gates are energized to drain photoelectrons from the ADP. The potentials of the clock gates and bias gates are decreased during the anti-blooming phase to prevent collecting electrons from the ADP during this phase.

During readout phase 608, represented by potential diagram 640, the bias of the reset gate is decreased, and the integrated photoelectrons are transferred by lowering the bias applied to the storage capacitors, thereby transferring charge to the FD capacitor. Anti-blooming gates may be energized to drain photoelectrons from the ADP during this phase.

Figure 7:
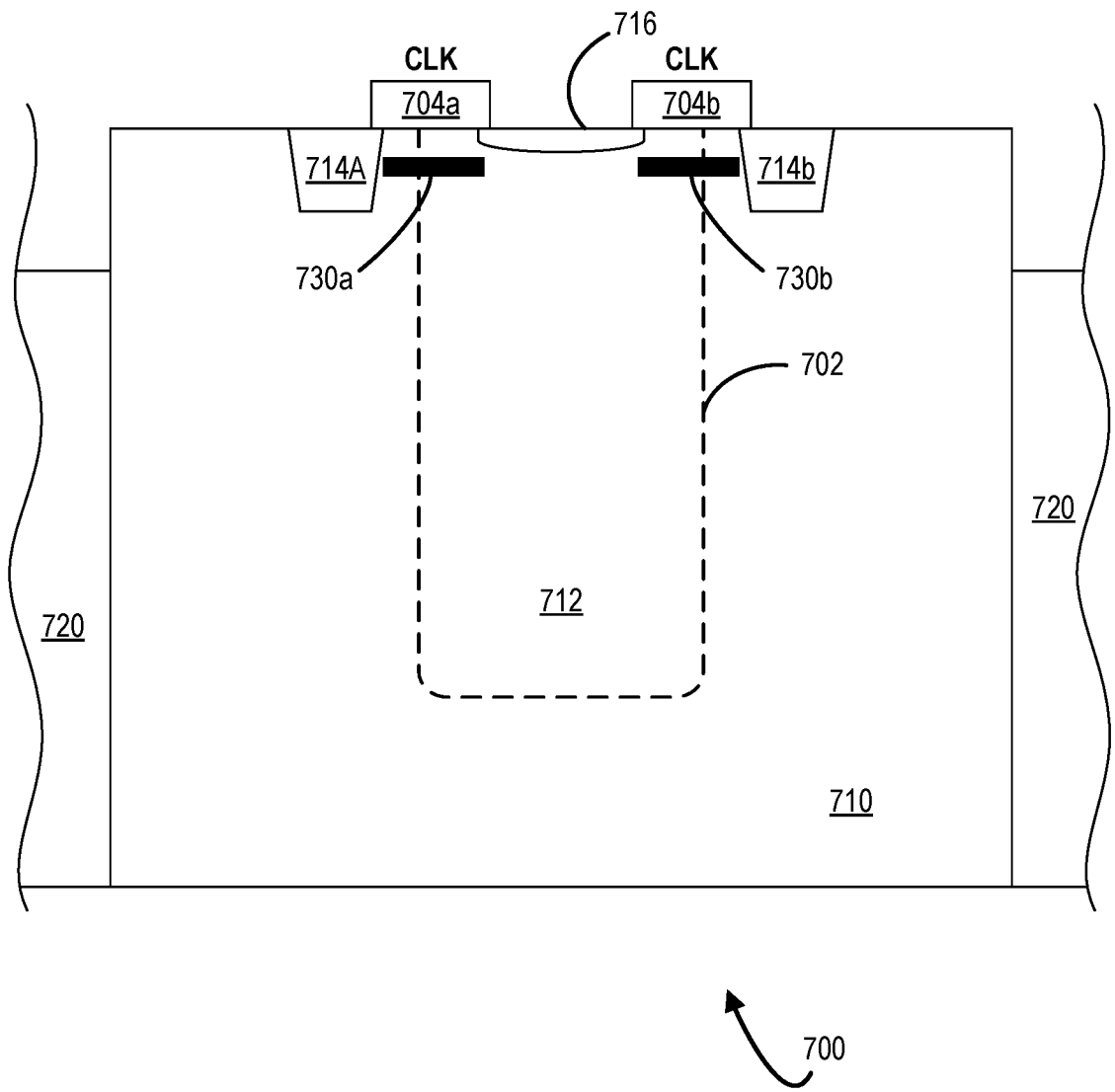
FIG. 7 schematically shows a magnified, sectional view of an example ToF pixel comprising an always-depleted photodiode and a potential barrier for each pixel tap.

In some ToF imaging applications, a higher dynamic range may be desired for pixels of a camera. The dynamic range of a ToF pixel is a function of a full-well capacity of the pixel. Thus, FIG. 7 schematically shows a sectional view of an example ToF pixel comprising potential barriers 730a, 730b corresponding to each pixel tap. The potential barriers 730a, 730b allow for the pixel 700 to have a higher full-well capacity than pixels 200 and 400. Pixel 700 is another example implementation of pixel 200 of FIG. 2.

Similar to pixels 200 and 400, pixel 700 comprises a doped first region 710 of one of p-doping and n-doping, and a more lightly-doped second region 712 of the other of p-doping and n-doping formed within the doped first region, forming P-N junction 702 therebetween and an always-depleted region within the more lightly-doped second region 712. As discussed above, the resulting electric field promotes separation of electron-hole pairs and the transport of photocharge within the pixel. Photocharge collected at clock gates 704a, 704b is transferred to in-pixel storage via bias gates. In some examples, pixel 700 further comprises STI regions 714a, 714b disposed at the transistor side of pixel 700, DTI regions 720, and/or divider region 716, as discussed above. In other examples, one or more of these features may be omitted.

As seen in FIG. 7, the barriers 730a, 730b are positioned within the more lightly-doped second region adjacent to and spaced from their respective clock gate 704a, 704b. The barriers may comprise the same doping as doped first region 710. Inclusion of barriers 730a, 730b may achieve higher dynamic range by enabling creation of potential barriers (i.e., potential barriers 812, discussed below with respect to FIG. 8B). During an integration phase, charge transfer to storage capacitors (CAP) occurs when the clock gates are deenergized, similar to the "charge pump" mode described above. However, in contrast to FIGS. 6A-6B, pixel 700 enables use of relatively lower clock voltages, as barriers 730a, 730b contain charge close to the clock gates. Further, residual charge at the clock gate after charge transfer is prevented from being expelled back to the ADP by the potential at barriers 730a, 730b. As discussed below, this can provide for a larger full well capacity compared to pixel 400, as the storage capacity of capacitors is not limited by the ADP potential.

Figure 8A:
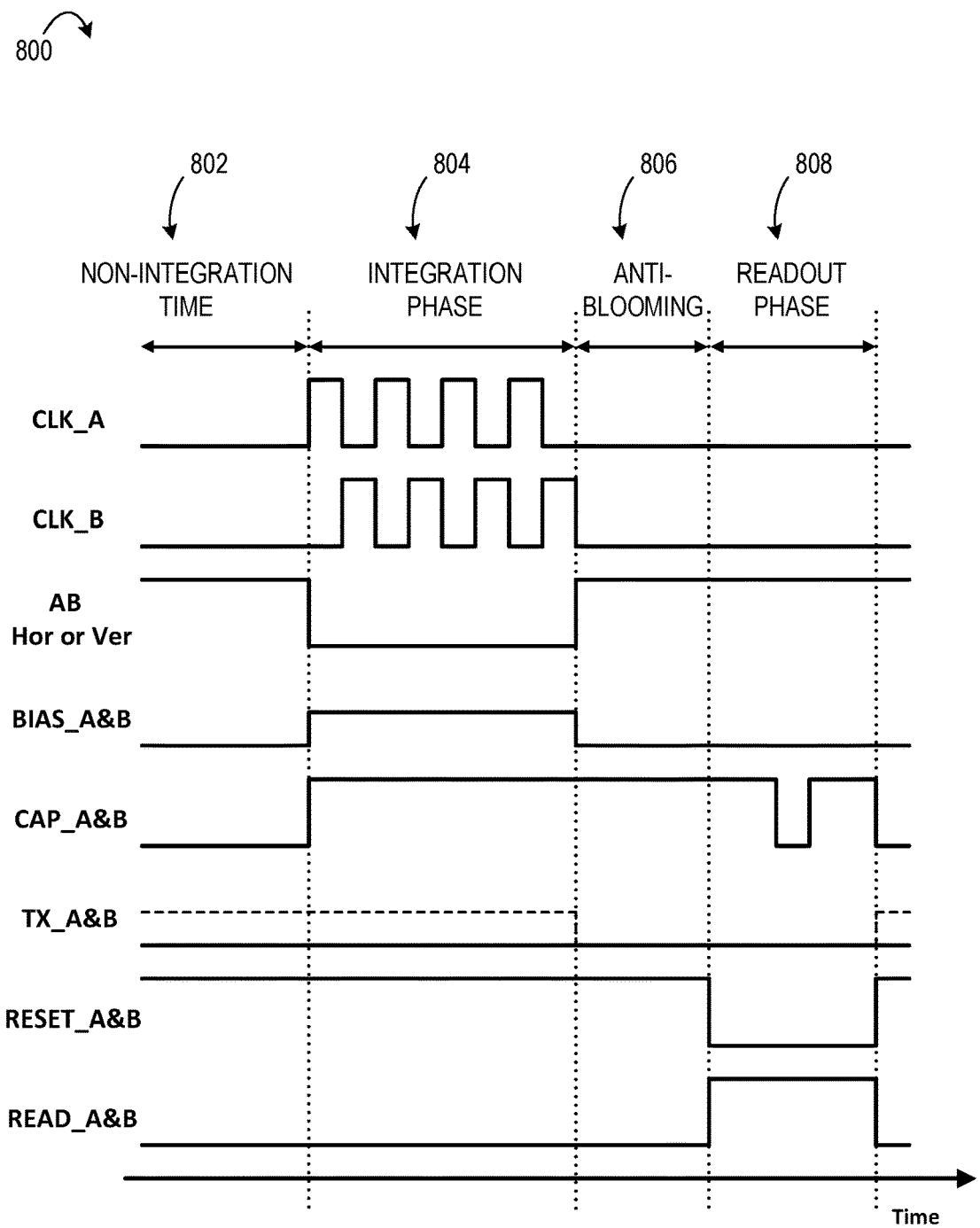
FIGS. 8A-8B show example timing and potential diagrams for the pixel of FIG. 7.
Figure 8B:
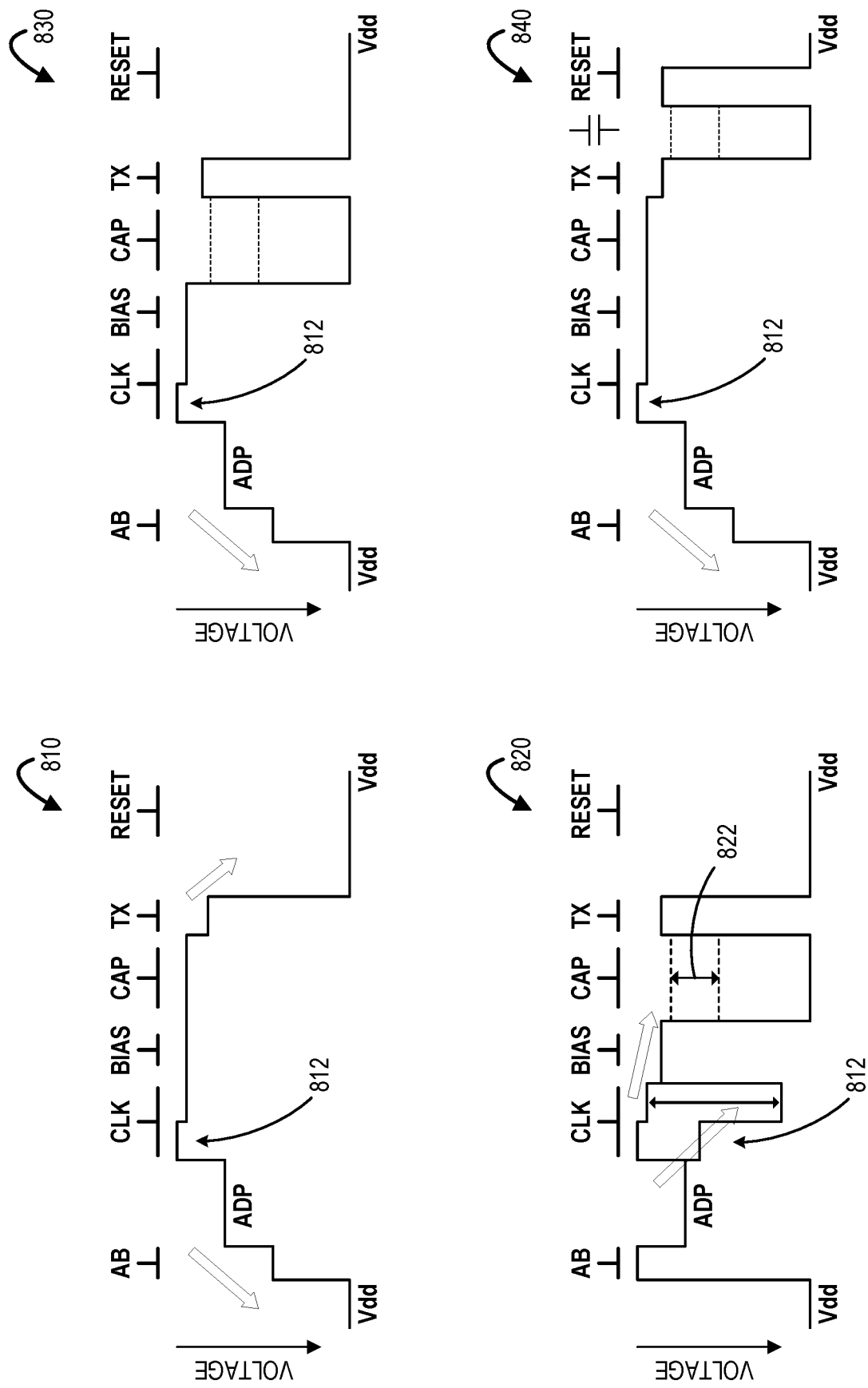

FIGS. 8A-8B illustrate an example operation of ToF pixel 700. FIG. 8A shows an example timing diagram 800, and FIG. 8B schematically illustrates potentials in the pixel and also charge flow at various phases of timing diagram 800. The description of FIGS. 8A and 8B is in the context of a more lightly-doped n region within a more heavily-doped p region, but may be applied a lightly-doped p region within a more heavily-doped n-region by appropriate changes in biases applied the various components according to the timing diagram.

Timing diagram 800 illustrates a non-integration phase 802, an integration phase 804, an anti-blooming phase 806, and a readout phase 808. In the non-integration phase, clock gate A and clock gate B are not modulated, but instead are held at a relatively lower voltage, thereby preventing the photoelectrons from being stored at in-pixel storage. Further, anti-blooming gates (AB) are held high to drain photoelectrons that are produced by the ADP during the non-integration period, and bias gates (BIAS) and storage capacitors (CAP) are held low. This phase is illustrated at potential diagram 810 of FIG. 8B, which shows charges drained to $V_{dd}$ via the anti-blooming gates and the reset gates during this phase. Potential barriers 812 are also held at a relatively low biases via their respective clock gates.

Integration phase 804 is illustrated by potential diagram 820. In the integration phase, the clock gates (CLK) are alternately energized to direct photoelectrons to respective storage capacitors (CAP), which are switched to high to store photoelectrons. Potential barrier 812 is formed for each tap by energizing barriers (e.g., barriers 730a, 730b of FIG. 7) with their respective clock gates (e.g., clock gates 704a, 704b of FIG. 7), thereby lowering the barrier so that photoelectrons in the ADP are transferred into the respective taps by the clock gates. The anti-blooming gates are switched to low to avoid draining photoelectrons via the anti-blooming gates. As shown in FIG. 8B at 820, modulation of a clock gate (CLK) alternately draws photoelectrons from the ADP for accumulation in the clock gate and "pumps" accumulated photoelectrons across the bias gate into the capacitor. When the clock gate is modulated low, the potential barrier 812 prevents photoelectrons from backflowing to the ADP, and instead directs flow to CAP. At the end of integration phase 804, the integrated charge from all modulation cycles is held at the storage capacitor for a respective pixel tap. In contrast to FIGS. 5B and 6B, the potential of transfer gates (TX_A&B) may be held low in all phases.

In contrast to potential diagram 620 of FIG. 6B, the potential of the bias gates is held lower than the ADP potential in potential diagram 820. In this scheme, photoelectron backflow is prevented via the potential barriers (e.g., barriers 730a, 730b of FIG. 7). Photoelectron flow during clock gate modulation is represented by the arrows in potential diagram 820. When the clock gate is high, the potential barrier is lowered by the clock gate to allow photoelectrons to flow from the ADP to accumulate at the clock gate. When the clock gate is low, photoelectrons accumulated at the clock gate transfer to the capacitor via the bias gate, while the potential barrier prevents backflow of photoelectrons to the ADP. As the potential of the bias gate can be held lower than the ADP potential during integration phase 804, the storage capacity of the capacitor is increased. This storage capacity increase 822 is represented by the difference between the dotted lines.

During anti-blooming phase 806, represented by potential diagram 830 of FIG. 8B, the anti-blooming gates are energized to drain photoelectrons from the ADP. Furthermore, the clock gates and bias gates are turned off during the anti-blooming phase, decreasing their potentials to prevent collecting photoelectrons from the ADP during this phase.

During readout phase 808, represented by potential diagram 840, the bias applied to the reset gate is decreased, and the integrated photocharge is transferred by lowering the bias applied to the storage capacitors, thereby transferring charge to the FD capacitor. Anti-blooming gates may be energized to drain photoelectrons from the ADP during this phase.

Figure 9:
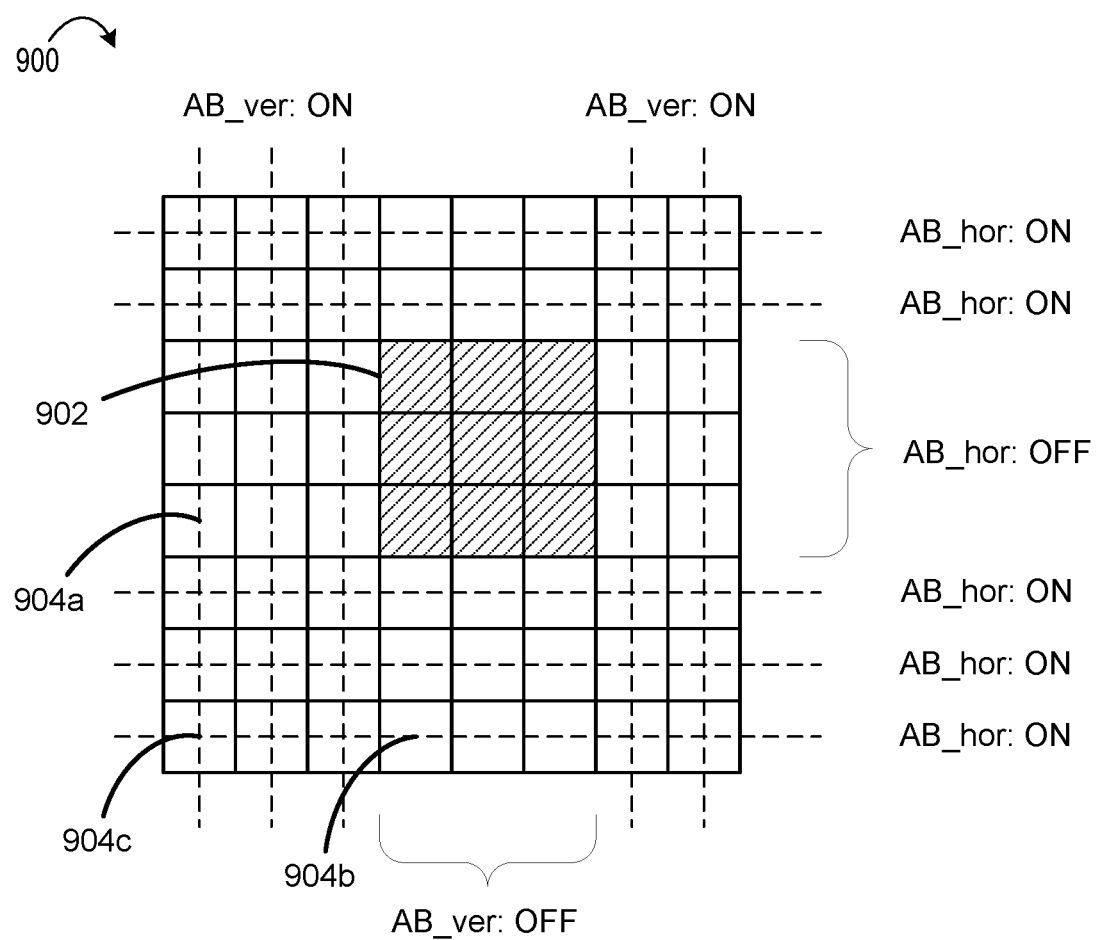
FIG. 9 shows an example scheme for selectively operating pixels within a region of interest while operating anti-blooming gates of pixels outside the region of interest.

As mentioned above, some ToF cameras may be configured to image regions of interest (ROI). In such cameras, illumination light is directed to the region of interest rather than the entire field of view of the camera, and the image sensor senses using a subset of pixels mapped to the region of interest, rather than with all pixels. FIG. 9 schematically illustrates pixels 902 mapped to an ROI. For example, pixels 902 may represent pixels in ROI 126 in depth image sensor 100 of FIG. 1. In the example shown, pixel array 900 comprises sixty-four pixels and ROI pixels 902 comprises nine pixels for illustrative purposes, but it will be understood that a pixel array and a ROI within the array may each comprise any number of pixels.

Pixels 902 mapped to the ROI may be controlled as described above, e.g. by any of timing diagram 500, timing diagram 600, and timing diagram 800, as examples. As such, the controller of the depth image sensor obtains a depth value for each pixel of ROI pixels 902. However, outside the ROI, horizontal anti-blooming (AB) gates and vertical AB gates are energized to drain photocharge during integration. In this example, horizontal AB gates are connected along a row, while vertical AB gates are connected along a column. Controlling a column, for example, controls AB gates for each pixel in that column. As such, the vertical AB gates in the columns corresponding to the ROI are not controlled to drain photocharge. Likewise, horizontal AB gates in the rows corresponding to the ROI are not controlled to drain photocharge. The use of both column and row AB gates allows the AB gates to be operated for all pixels outside of the ROI.

In some examples, the depth image sensor may be configured to operate full-time in a ROI depth image capture mode. In other examples, the depth image sensor may operate in a ROI capture mode on-demand. In either case, the use of the ROI imaging mode may help to conserve device power, as the pixel tap modulation occurs only within a sub-array of pixels. Further, where the illumination source is configured to illuminate a sub-field of view corresponding to the ROI, a higher-intensity illumination may be used in the sub-field. This may increase the intensity of reflected light 122', thereby contributing to a stronger signal to noise ratio.

Figure 10:
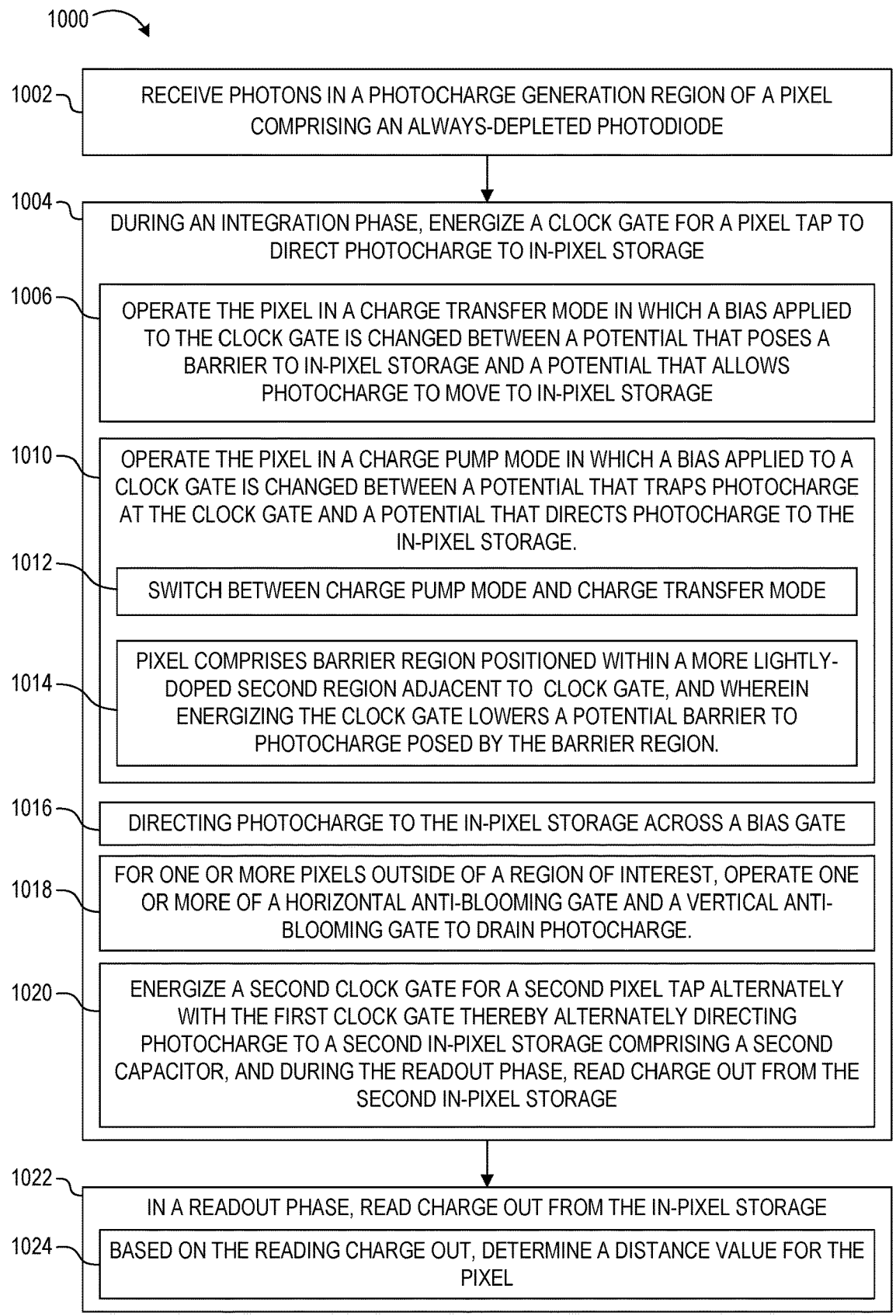
FIG. 10 is a flow diagram depicting an example method for operating a time-of-flight pixel comprising an always-depleted photodiode.

FIG. 10 shows an example method 1000 of operating a pixel of a depth image sensor, such as pixel 200, pixel 400, or pixel 700. Method 1000 comprises, at 1002, receiving photons in a photocharge generation region of the pixel, the photocharge generation region of the pixel comprising an always-depleted photodiode formed by a doped first region comprising one of p-doping or n-doping and a more lightly-doped second region located within the doped first region, the more lightly-doped second region comprising the other of p-doping or n-doping. Method 1000 further comprises, at 1004, during an integration phase, energizing a clock gate for a pixel tap, thereby directing photocharge generated in the photocharge generation region to an in-pixel storage comprising a capacitor.

In some examples, method 1000 may comprise, at 1006, operating the pixel in a charge transfer mode, wherein energizing the clock gate comprises changing a bias applied to the clock gate from a potential that poses a barrier to the photocharge from moving to the in-pixel storage to a potential that allows the photocharge to move to the in-pixel storage.

Further, in some examples, at 1010, the method may comprise operating the pixel in a charge pump mode, wherein energizing the clock gate comprises changing a bias applied to the clock gate between a potential that traps photocharge at the clock gate and a potential that directs photocharge to the in-pixel storage. In some examples, at 1012, the method comprises switching from operating the pixel in a charge pump mode to operating the pixel in a charge transfer mode. In some such examples, the pixel comprises a barrier region of the one of p-doping or n-doping that is positioned within the more lightly-doped second region adjacent to and spaced from the clock gate. In such examples, operating the clock gate lowers a potential barrier to photocharge posed by the barrier region, as indicated at 1014.

In some examples, as indicated at 1016, directing photocharge to the in-pixel storage comprises directing photocharge through a bias gate. As discussed above, the potential of the bias gate may be set to prevent backflow of photocharge from a storage capacitor to the ADP. Further, in some examples, when the pixel is located outside of a region of interest, method 1000 comprises, at 1018, operating one or more of a horizontal anti-blooming gate and a vertical anti-blooming gate to drain photocharge.

In examples that utilize two or more pixel taps per pixel, the clock gate for the pixel tap is a first clock gate for a first pixel tap and the in-pixel storage is a first in-pixel storage comprising a first capacitor. In such examples, method 1000 further comprises, at 1020, during the integration phase, energizing a second clock gate for a second pixel tap alternately with the first clock gate thereby alternately directing photocharge to a second in-pixel storage comprising a second capacitor, and during the readout phase, reading charge out from the second in-pixel storage. Method 1000 further comprises, at 1022, in a readout phase, reading charge out from the in-pixel storage, and at 1024, determining a distance value for the pixel.

In some examples, the methods and processes described herein may be tied to a computing system of one or more computing devices. In particular, such methods and processes may be implemented as a computer-application program or service, an application-programming interface (API), a library, and/or other computer-program product.

Figure 11:
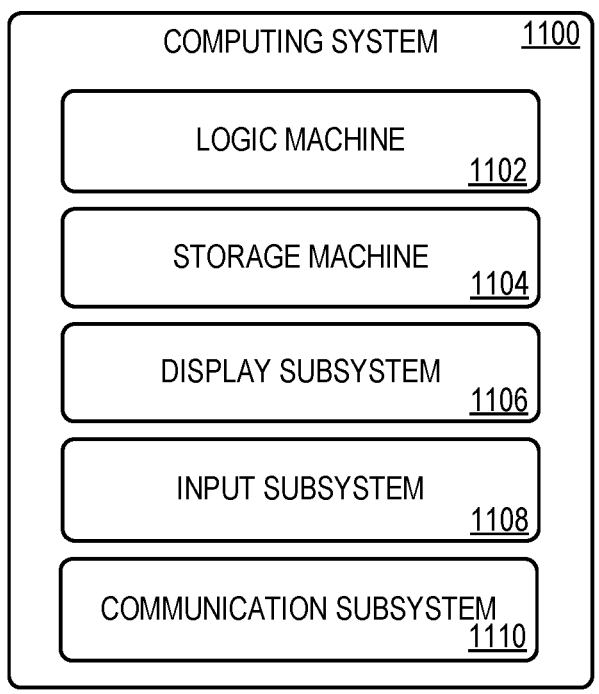
FIG. 11 is a block diagram of an example computing system.

FIG. 11 schematically shows a non-limiting embodiment of a computing system 1100 that can enact one or more of the methods and processes described above. Computing system 1100 is shown in simplified form. Computing system 1100 may take the form of one or more personal computers, server computers, tablet computers, home-entertainment computers, network computing devices, gaming devices, mobile computing devices, mobile communication devices (e.g., smart phone), and/or other computing devices.

Computing system 1100 includes a logic machine 1102 and a storage machine 1104. Computing system 1100 may optionally include a display subsystem 1106, input subsystem 1108, communication subsystem 1110, and/or other components not shown in FIG. 11.

Logic machine 1102 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 1104 includes one or more physical devices configured to hold instructions executable by the logic machine to implement the methods and processes described herein. When such methods and processes are implemented, the state of storage machine 1104 may be transformed—e.g., to hold different data.

Storage machine 1104 may include removable and/or built-in devices. Storage machine 1104 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 1104 may include volatile, nonvolatile, dynamic, static, read/write, read-only, random-access, sequential-access, location-addressable, file-addressable, and/or content-addressable devices.

It will be appreciated that storage machine 1104 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 1102 and storage machine 1104 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1106 may be used to present a visual representation of data held by storage machine 1104. This visual representation may take the form of a graphical user interface (GUI). As the herein described methods and processes change the data held by the storage machine, and thus transform the state of the storage machine, the state of display subsystem 1106 may likewise be transformed to visually represent changes in the underlying data. Display subsystem 1106 may include one or more display devices utilizing virtually any type of technology. Such display devices may be combined with logic machine 1102 and/or storage machine 1104 in a shared enclosure, or such display devices may be peripheral display devices.

When included, input subsystem 1108 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 1110 may be configured to communicatively couple computing system 1100 with one or more other computing devices. Communication subsystem 1110 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 1100 to send and/or receive messages to and/or from other devices via a network such as the Internet.

Another example provides a method of operating a pixel of a depth image sensor, the method comprising receiving photons in a photocharge generation region of the pixel, the photocharge generation region of the pixel comprising an always-depleted photodiode formed by a doped first region comprising one of p-doping or n-doping and a more lightly-doped second region located within the doped first region, the more lightly-doped second region comprising the other of p-doping or n-doping; during an integration phase, energizing a clock gate for a pixel tap, thereby directing photocharge generated in the photocharge generation region to an in-pixel storage comprising a capacitor; and in a readout phase, reading charge out from the in-pixel storage. In some such examples, the method may comprise operating the pixel in a charge transfer mode, wherein energizing the clock gate comprises changing a bias applied to the clock gate from a potential that poses a barrier to the photocharge from moving to the in-pixel storage to a potential that allows the photocharge to move to the in-pixel storage. In some such examples, the method comprises operating the pixel in a charge pump mode, wherein energizing the clock gate comprises changing a bias applied to the clock gate between a potential that traps photocharge at the clock gate and a potential that directs photocharge to the in-pixel storage. Additionally or alternatively, the method further comprises switching from operating the pixel in the charge pump mode to operating the pixel in the charge transfer mode. Additionally or alternatively, the pixel further comprises a barrier region of the one of p-doping or n-doping that is positioned within the more lightly-doped second region adjacent to and spaced from the clock gate, and energizing the clock gate lowers a potential barrier to photocharge posed by the barrier region. Additionally or alternatively, directing photocharge to the in-pixel storage comprises directing photocharge across a bias gate. Additionally or alternatively, the clock gate for the pixel tap is a first clock gate for a first pixel tap, the in-pixel storage is a first in-pixel storage comprising a first capacitor, and the method further comprises, during the integration phase, energizing a second clock gate for a second pixel tap alternately with the first clock gate thereby alternately directing photocharge to a second in-pixel storage comprising a second capacitor, and during the readout phase, reading charge out from the second in-pixel storage. Additionally or alternatively, the method further comprises, when the pixel is located outside of a region of interest, operating one or more of a horizontal anti-blooming gate and a vertical anti-blooming gate to drain photocharge. In some such examples, the method may additionally or alternatively comprise, based on the reading charge out, determining a distance value for the pixel.

Another example provides a depth image sensor, comprising a plurality of pixels, each pixel configured to sense light incident on the pixel, and each pixel of the plurality of pixels comprising a doped first region comprising one of p-doping or n-doping, and a more lightly-doped second region disposed within the doped first region, the more lightly-doped second region comprising the other of p-doping or n-doping, thereby forming an always-depleted photodiode (ADP), a first pixel tap comprising a first clock gate disposed adjacent to the more lightly-doped second region of the ADP, and also comprising a first in-pixel storage capacitor, and a second pixel tap comprising a second clock gate disposed adjacent to the more lightly-doped second region of the ADP, and also comprising a second in-pixel storage capacitor and a controller configured to control each pixel of the plurality of pixels to, during an integration phase, alternately apply a first relative bias to the first clock gate and the second clock gate to direct photocharge generated in the ADP to the first in-pixel storage capacitor, and a second relative bias to the first clock gate and the second clock gate to direct photocharge generated in the ADP to the second in-pixel storage capacitor, and in a readout phase, read charge out from the first in-pixel storage capacitor and the second in-pixel storage capacitor. In some such examples, for each pixel of the plurality of pixels, the first pixel tap comprises a first bias gate between the first clock gate and the first in-pixel storage, and the second pixel tap comprises a second bias gate between the second clock gate and the second in-pixel storage. Additionally or alternatively, the controller is configured to control the first bias gate to set a first relative bias at the first bias gate during the integration phase to allow photocharge to flow to the first in-pixel storage, and to set a second relative bias at the first bias gate to prevent charge from backflowing. Additionally or alternatively, the first relative bias comprises a voltage that traps photocharge at the first clock gate, and a voltage on the second clock gate that directs photocharge trapped at the second clock gate across the second bias gate to the second in-pixel storage, and the second relative bias comprises a bias on the first clock gate that directs photocharge trapped at the first clock gate across the first bias gate to the first in-pixel storage, and a bias on the second clock gate that traps photocharge at the second clock gate. Additionally or alternatively, for each pixel of the plurality of pixels, the first pixel tap further comprises a first potential barrier positioned within the more lightly-doped second region adjacent to and spaced from the first clock gate, and the second pixel tap further comprises a second potential barrier positioned within the more lightly-doped second region adjacent to and spaced from the second clock gate. Additionally or alternatively, the depth image sensor further comprises a deep trench isolation region disposed between neighboring pixels of the plurality of pixels. Additionally or alternatively, the depth image sensor further comprises, for each pixel of the plurality of pixels, a divider region disposed within the more lightly-doped second region and between the first clock gate and the second clock gate, the divider region comprising the one of p-doping or n-doping. Additionally or alternatively, the more lightly-doped second region is doped at a doping concentration between 1.0% to 10% of a doping concentration of the doped first region. Additionally or alternatively, each pixel of the plurality of pixels further comprises a horizontal anti-blooming gate and a vertical anti-blooming gate. Additionally or alternatively, the controller is configured to operate the horizontal anti-blooming gate and the vertical anti-blooming gate between the integration phase and the readout phase to drain photocharge between the integration phase and the readout phase. Additionally or alternatively, the controller is configured to control the pixels outside the region of interest to, during the integration phase, drain photocharge in the ADP by operating one or more of the horizontal anti-blooming gate and the vertical anti-blooming gate.

Another example provides a depth image sensor, comprising a steerable illumination device configured to selectively illuminate a space in a 3D scene, an image sensor comprising a plurality of pixels, each pixel configured to sense light incident on the pixel, and each pixel of the plurality of pixels comprising a doped first region of the semiconductor die, the doped first region comprising one of p-doping or n-doping, and a more lightly-doped second region of the semiconductor die disposed within the doped first region, the more lightly-doped second region comprising the other of p-doping or n-doping, thereby forming an always-depleted photodiode (ADP), a pixel tap comprising a clock gate disposed adjacent to the more lightly-doped second region of the ADP, and in-pixel storage, a horizontal anti-blooming gate, and a vertical anti-blooming gate, and a controller. The controller is configured to steer illumination light to selectively illuminate a region of interest in the 3D scene, the region of interest in the 3D scene corresponding to a region of interest on the image sensor, for each pixel within the region of interest on the image sensor, control the pixel to during an integration phase, apply a bias to the clock gate to direct photocharge generated in the ADP to the in-pixel storage capacitor, and in a readout phase, read charge out from the in-pixel storage capacitor, and for each pixel outside the region of interest, control the pixel to energize one or more of the horizontal anti-blooming gate and the vertical anti-blooming gate to drain photocharge. Additionally or alternatively, for each pixel of the plurality of pixels, the pixel tap further comprises a potential barrier positioned within the more lightly-doped second region adjacent to and spaced from the clock gate. Additionally or alternatively, the controller is configured to, for each pixel within the region of interest, control the pixel to energize the horizontal anti-blooming gate and the vertical anti-blooming gate between the integration phase and the readout phase to drain photocharge between the integration phase and a subsequent integration phase.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method of operating a pixel of a depth image sensor, the method comprising:
receiving photons in a photocharge generation region of the pixel, the photocharge generation region of the pixel comprising an always-depleted photodiode formed by a doped first region comprising one of p-doping or n-doping and a more lightly-doped second region located within the doped first region, the more lightly-doped second region comprising the other of p-doping or n-doping;
during an integration phase, energizing a first clock gate for a first pixel tap, thereby directing photocharge generated in the photocharge generation region to a first in-pixel storage comprising a first capacitor;
during the integration phase, energize a second clock gate for a second pixel tap alternately with the first clock gate, thereby alternately directing photocharge to a second in-pixel storage comprising a second capacitor; and
in a readout phase, reading charge out from the first in-pixel storage, and reading charge out from the second in-pixel storage.

2. The method of claim 1, further comprising operating the pixel in a charge transfer mode, wherein energizing the first clock gate comprises changing a bias applied to the first clock gate from a potential that poses a barrier to the photocharge from moving to the first in-pixel storage to a potential that allows the photocharge to move to the first in-pixel storage.

3. The method of claim 1, further comprising operating the pixel in a charge pump mode, wherein energizing the first clock gate comprises changing a bias applied to the first clock gate between a potential that traps photocharge at the first clock gate and a potential that directs photocharge to the first in-pixel storage.

4. The method of claim 3, further comprising switching from operating the pixel in the charge pump mode to operating the pixel in a charge transfer mode;
wherein operating the pixel in the charge transfer mode comprises changing a bias applied to the first clock gate from a potential that poses a barrier to the photocharge from moving to the first in-pixel storage to a potential that allows the photocharge to move to the first in-pixel storage.

5. The method of claim 2, wherein the pixel further comprises a barrier region of the one of p-doping or n-doping that is positioned within the more lightly-doped second region adjacent to and spaced from the first clock gate, and wherein energizing the first clock gate lowers a potential barrier to photocharge posed by the barrier region.

6. The method of claim 5, wherein directing photocharge to the first in-pixel storage comprises directing photocharge across a first bias gate, and directing photocharge to the second in-pixel storage comprises directing photocharge across a second bias gate.

7. The method of claim 1, further comprising, when the pixel is located outside of a region of interest, operating one or more of a horizontal anti-blooming gate and a vertical anti-blooming gate to drain photocharge.

8. A depth image sensor, comprising:
a plurality of pixels, each pixel configured to sense light incident on the pixel, and each pixel of the plurality of pixels comprising:
a doped first region comprising one of p-doping or n-doping, and a more lightly-doped second region disposed within the doped first region, the more lightly-doped second region comprising the other of p-doping or n-doping, thereby forming an always-depleted photodiode (ADP), a first pixel tap comprising a first clock gate disposed adjacent to the more lightly-doped second region of the ADP, and also comprising a first in-pixel storage capacitor, and a second pixel tap comprising a second clock gate disposed adjacent to the more lightly-doped second region of the ADP, and also comprising a second in-pixel storage capacitor; and a controller configured to control each pixel of the plurality of pixels to, during an integration phase, alternately apply a first relative bias to the first clock gate and the second clock gate to direct photocharge generated in the ADP to the first in-pixel storage capacitor, and a second relative bias to the first clock gate and the second clock gate to direct photocharge generated in the ADP to the second in-pixel storage capacitor, and in a readout phase, read charge out from the first in-pixel storage capacitor and the second in-pixel storage capacitor.

9. The depth image sensor of claim 8, wherein, for each pixel of the plurality of pixels, the first pixel tap further comprises a first bias gate between the first clock gate and the first in-pixel storage, and the second pixel tap further comprises a second bias gate between the second clock gate and the second in-pixel storage.

10. The depth image sensor of claim 9, wherein the controller is configured to control the first bias gate to set a first relative bias at the first bias gate during the integration phase to allow photocharge to flow to the first in-pixel storage, and to set a second relative bias at the first bias gate to prevent charge from backflowing.

11. The depth image sensor of claim 9, wherein the first relative bias comprises a voltage that traps photocharge at the first clock gate, and a voltage on the second clock gate that directs photocharge trapped at the second clock gate across the second bias gate to the second in-pixel storage; and wherein the second relative bias comprises a bias on the first clock gate that directs photocharge trapped at the first clock gate across the first bias gate to the first in-pixel storage, and a bias on the second clock gate that traps photocharge at the second clock gate.

12. The depth image sensor of claim 8, wherein for each pixel of the plurality of pixels, the first pixel tap further comprises a first potential barrier positioned within the more lightly-doped second region adjacent to and spaced from the first clock gate, and the second pixel tap further comprises a second potential barrier positioned within the more lightly-doped second region adjacent to and spaced from the second clock gate.

13. The depth image sensor of claim 8, further comprising a deep trench isolation region disposed between neighboring pixels of the plurality of pixels.

14. The depth image sensor of claim 8, further comprising, for each pixel of the plurality of pixels, a divider region disposed within the more lightly-doped second region and between the first clock gate and the second clock gate, the divider region comprising the one of p-doping or n-doping.

15. The depth image sensor of claim 8, wherein each pixel of the plurality of pixels further comprises a horizontal anti-blooming gate and a vertical anti-blooming gate.

16. The depth image sensor of claim 15, wherein the controller is configured to operate the horizontal anti-blooming gate and the vertical anti-blooming gate between the integration phase and the readout phase to drain photocharge between the integration phase and the readout phase.

17. A depth image sensor, comprising:

a steerable illumination device configured to selectively illuminate a space in a 3D scene;

an image sensor comprising a plurality of pixels, each pixel configured to sense light incident on the pixel, and each pixel of the plurality of pixels comprising:

a doped first region of the semiconductor die, the doped first region comprising one of p-doping or n-doping, and a more lightly-doped second region of the semiconductor die disposed within the doped first region, the more lightly-doped second region comprising the other of p-doping or n-doping, thereby forming an always-depleted photodiode (ADP), a pixel tap comprising a clock gate disposed adjacent to the more lightly-doped second region of the ADP, and in-pixel storage, a horizontal anti-blooming gate, and a vertical anti-blooming gate; and a controller configured to:

steer illumination light to selectively illuminate a region of interest in the 3D scene, the region of interest in the 3D scene corresponding to a region of interest on the image sensor;

for each pixel within the region of interest on the image sensor, control the pixel to:

during an integration phase, apply a bias to the clock gate to direct photocharge generated in the ADP to the in-pixel storage capacitor, and in a readout phase, read charge out from the in-pixel storage capacitor, and for each pixel outside the region of interest, control the pixel to:

energize one or more of the horizontal anti-blooming gate and the vertical anti-blooming gate to drain photocharge.

18. The depth image sensor of claim 17, wherein, for each pixel of the plurality of pixels, the pixel tap further comprises a potential barrier positioned within the more lightly-doped second region adjacent to and spaced from the clock gate.

19. The depth image sensor of claim 17, wherein the controller is configured to, for each pixel within the region of interest, control the pixel to energize the horizontal anti-blooming gate and the vertical anti-blooming gate between the integration phase and the readout phase to drain photocharge between the integration phase and a subsequent integration phase.

* * * * *